United States Patent
Jackson et al.

(10) Patent No.: US 7,197,299 B2
(45) Date of Patent: Mar. 27, 2007

(54) MULTIPLE MESSAGE MULTILEVEL ANALOG SIGNAL RECORDING AND PLAYBACK SYSTEM CONTAINING CONFIGURABLE ANALOG PROCESSING FUNCTIONS

(75) Inventors: Geoffrey B. Jackson, Campbell, CA (US); Saleel V. Awsare, Redwood City, CA (US); Lawrence D. Engh, Redwood City, CA (US); Peter Holzmann, Campbell, CA (US); Oliver C. Kao, Cupertino, CA (US); Carl R. Palmer, Los Gatos, CA (US); Aditya Raina, Santa Clara, CA (US)

(73) Assignee: Winbond Electronics Corporation, Hsinchu (TW)

( * ) Notice: Subject to any disclaimer, the term of this patent is extended or adjusted under 35 U.S.C. 154(b) by 501 days.

(21) Appl. No.: 10/752,630

(22) Filed: Jan. 7, 2004

(65) Prior Publication Data

US 2004/0142680 A1   Jul. 22, 2004

Related U.S. Application Data

(63) Continuation of application No. 09/184,454, filed on Nov. 2, 1998, now abandoned.

(51) Int. Cl.
*H04Q 7/22* (2006.01)
*H04B 1/28* (2006.01)

(52) U.S. Cl. .................. 455/412.1; 455/333; 455/575.9

(58) Field of Classification Search ................ 455/333, 455/412.1, 575.9, 575.1, 152.1, 345, 550.1; 365/45, 185.03, 189.01

See application file for complete search history.

(56) References Cited

U.S. PATENT DOCUMENTS

| | | | |
|---|---|---|---|
| 4,317,142 A | | 2/1982 | Wray |
| 4,342,059 A | | 7/1982 | Wray |
| 4,524,452 A | | 6/1985 | Marshak |
| 4,890,259 A | * | 12/1989 | Simko .................. 365/185.03 |
| 4,989,179 A | * | 1/1991 | Simko .................. 365/185.03 |
| 5,046,101 A | | 9/1991 | Lovejoy |
| 5,164,915 A | | 11/1992 | Blyth |

(Continued)

FOREIGN PATENT DOCUMENTS

| EP | 0 865 046 A2 | 9/1998 |
|---|---|---|
| EP | 0 899 746 A2 | 3/1999 |

OTHER PUBLICATIONS

ISD (Information Storage Devices, Inc.), ISD4003 Series Single-Chip Voice Record/Playback Devices 4-,5-,6-, and 8-Minute Durations, 1997, pp. 1-25.

(Continued)

*Primary Examiner*—Sonny Trinh
(74) *Attorney, Agent, or Firm*—Blakely Sokoloff Taylor & Zafman LLP

(57) ABSTRACT

A multilevel analog recording and playback system is described. The analog recording and playback system provides a variety of analog processing functions to enhance system level integration. The analog recording and playback system is an fully configurable integrated device that includes a plurality of signal paths, a microphone automatic gain control ("AGC") circuit, volume control and filtering circuit, speaker driver circuit, gain selectable analog input, auxiliary input and output paths, configurable summation amplifiers having mixing features, multilevel analog memory storage array, and user selectable programming duration.

21 Claims, 27 Drawing Sheets

U.S. PATENT DOCUMENTS

| | | | |
|---|---|---|---|
| 5,172,364 | A | 12/1992 | Yoshimoto et al. |
| 5,241,494 | A * | 8/1993 | Blyth et al. ............ 365/185.03 |
| 5,412,731 | A | 5/1995 | Desper |
| 5,444,676 | A | 8/1995 | Balsamo et al. |
| 5,623,436 | A * | 4/1997 | Sowards et al. .............. 365/45 |
| 5,629,890 | A | 5/1997 | Engh |
| 5,664,060 | A | 9/1997 | Jarrett et al. |
| 5,754,470 | A | 5/1998 | Engh et al. |
| 5,828,592 | A * | 10/1998 | Tran et al. .................... 365/45 |
| 5,892,503 | A | 4/1999 | Kim |
| 5,898,605 | A | 4/1999 | Smarandoiu et al. |
| 5,959,876 | A * | 9/1999 | Gordon et al. ................ 365/45 |
| 5,959,883 | A * | 9/1999 | Brennan et al. ....... 365/185.03 |
| 6,185,119 | B1 * | 2/2001 | Haeberli et al. .............. 365/45 |
| 6,760,262 | B2 * | 7/2004 | Haeberli et al. ....... 365/189.09 |
| 6,865,186 | B1 * | 3/2005 | Jackson et al. ............. 370/419 |

OTHER PUBLICATIONS

ISD (Information Storage Devices, Inc.), "Applications Brief #26, Upgrading an ISD33000 Design to an ISD4000 series device", Jun. 18, 1997.

ISD (Information Storage Devices, Inc.), ISD2560/75/90/120 Products Single- Chip Voice Record/Playback Devices 60-, 75-, 90-, and 120-Second Durations, Apr. 1998, pp. 1-30.

ISD (Information Storage Devices, Inc.), ISD33060/075/090/120-4 Products Single-Chip Voice Record/Playback Devices 60-, 75-, 90-, and 120-Second Durations, Apr. 1998, pp. 1-26.

ISD (Information Storage Devices, Inc.), ISD33120/150/180/240 Products Single-Chip Voice Record/Playback Devices 2-, 2.5-, 3-, and 4-Minute Durations, Apr. 1998, pp. 1-26.

* cited by examiner

Configuration Register 0

| Control Bit | Name | Block Affected | Description |
|---|---|---|---|
| CFG0 <15> | AIG1 | ANAIN AMP | Gain set |
| CFG0 <14> | AIG0 | ANAIN AMP | Gain set |
| CFG0 <13> | AIPD | ANAIN AMP | Power down |
| CFG0 <12> | AXG1 | AUXIN AMP | Gain set |
| CFG0 <11> | AXG0 | AUXIN AMP | Gain set |
| CFG0 <10> | AXPD | AUXIN AMP | Power down |
| CFG0 <9> | INS0 | INPUT MUX | Input source select |
| CFG0 <8> | AOS2 | ANAOUT MUX | Mux select |
| CFG0 <7> | AOS1 | ANAOUT MUX | Mux select |
| CFG0 <6> | AOS0 | ANAOUT MUX | Mux select |
| CFG0 <5> | AOPD | ANAOUT AMP | Power down |
| CFG0 <4> | OPS1 | OUTPUT MUX | Mux select |
| CFG0 <3> | OPS0 | OUTPUT MUX | Mux select |
| CFG0 <2> | OPA1 | OUTPUT AMPS | Amplifier/gain select |
| CFG0 <1> | OPA0 | OUTPUT AMPS | Amplifier/gain select |
| CFG0 <0> | VLPD | VOLUME CONTROL | Power down |

Configuration Register 1

| Control Bit | Name | Block Affected | Description |
|---|---|---|---|
| CFG1 <15> | VLS1 | VOL MUX | Mux select |
| CFG1 <14> | VLS0 | VOL MUX | Mux select |
| CFG1 <13> | VOL2 | VOLUME CONTROL | Volume level |
| CFG1 <12> | VOL1 | VOLUME CONTROL | Volume level |
| CFG1 <11> | VOL0 | VOLUME CONTROL | Volume level |
| CFG1 <10> | S1S1 | SUM1 MUX | Mux select |
| CFG1 <9> | S1S0 | SUM1 MUX | Mux select |
| CFG1 <8> | S1M1 | SUM1 AMP | Sum1 select |
| CFG1 <7> | S1M0 | SUM1 AMP | Sum1 select |
| CFG1 <6> | S2M1 | SUM2 AMP | Sum2 select |
| CFG1 <5> | S2M0 | SUM2 AMP | Sum2 select |
| CFG1 <4> | FLS0 | FILTER MUX | Mux select |
| CFG1 <3> | FLD1 | FILTER CLOCK | Sample rate select |
| CFG1 <2> | FLD0 | FILTER CLOCK | Sample rate select |
| CFG1 <1> | FLPD | FILTER | Power down |
| CFG1 <0> | AGPD | AGC AMP | Power down |

FIGURE 4C

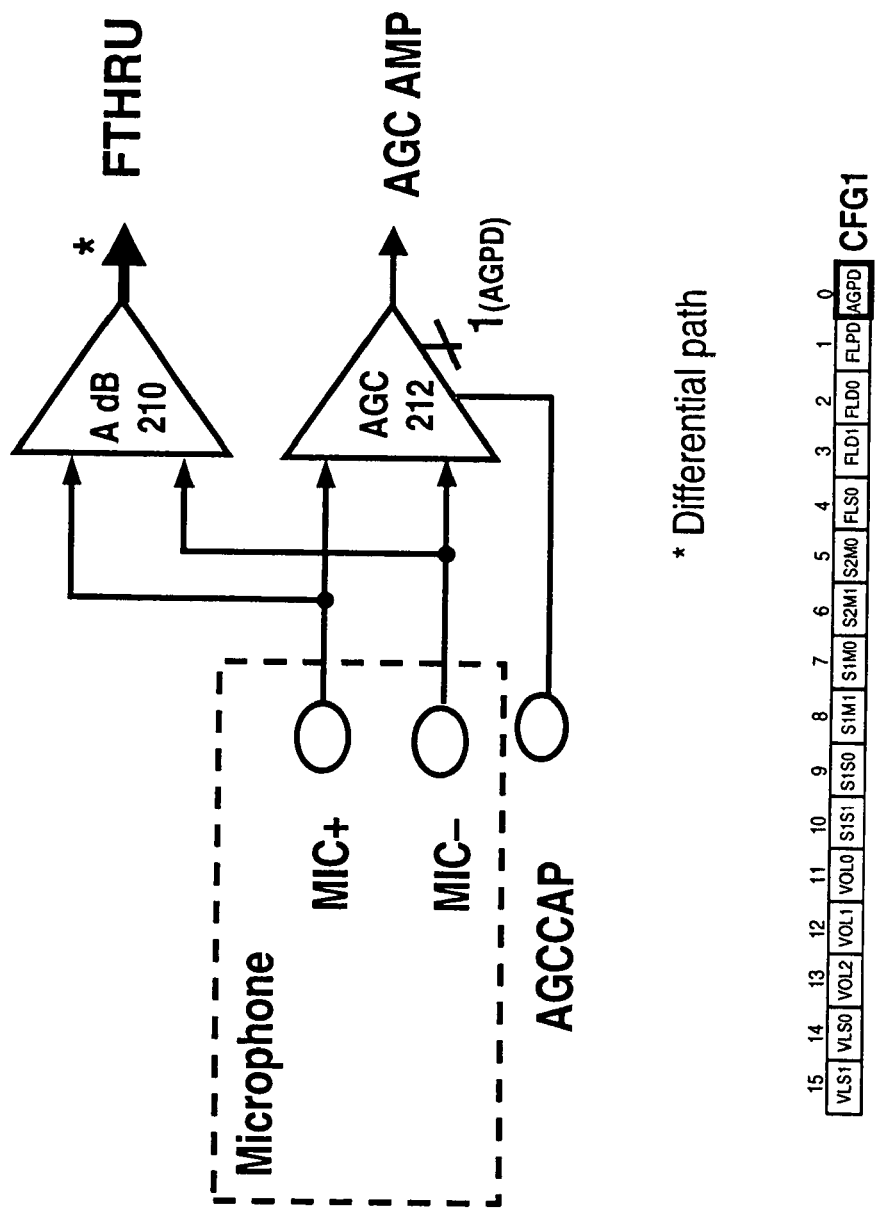

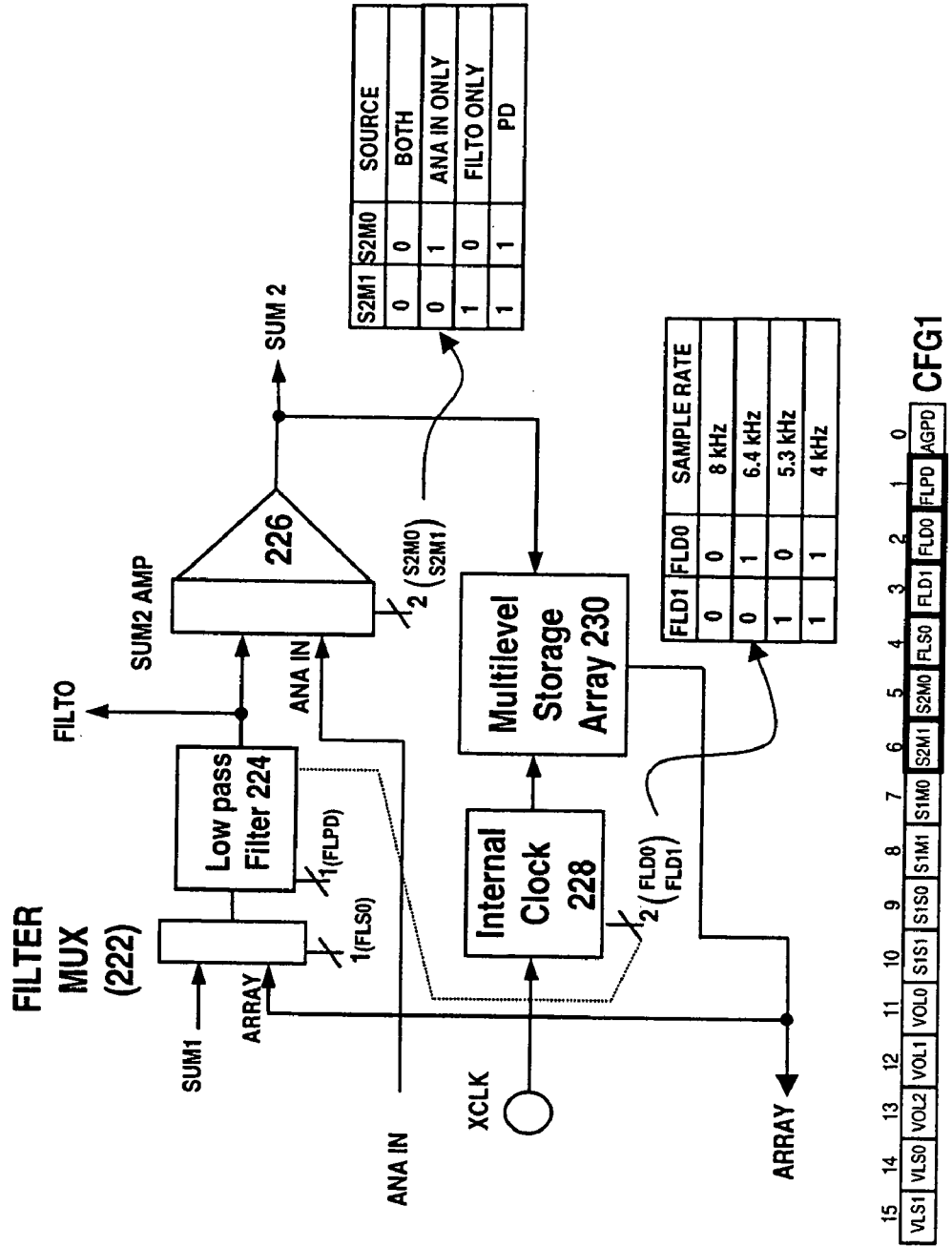

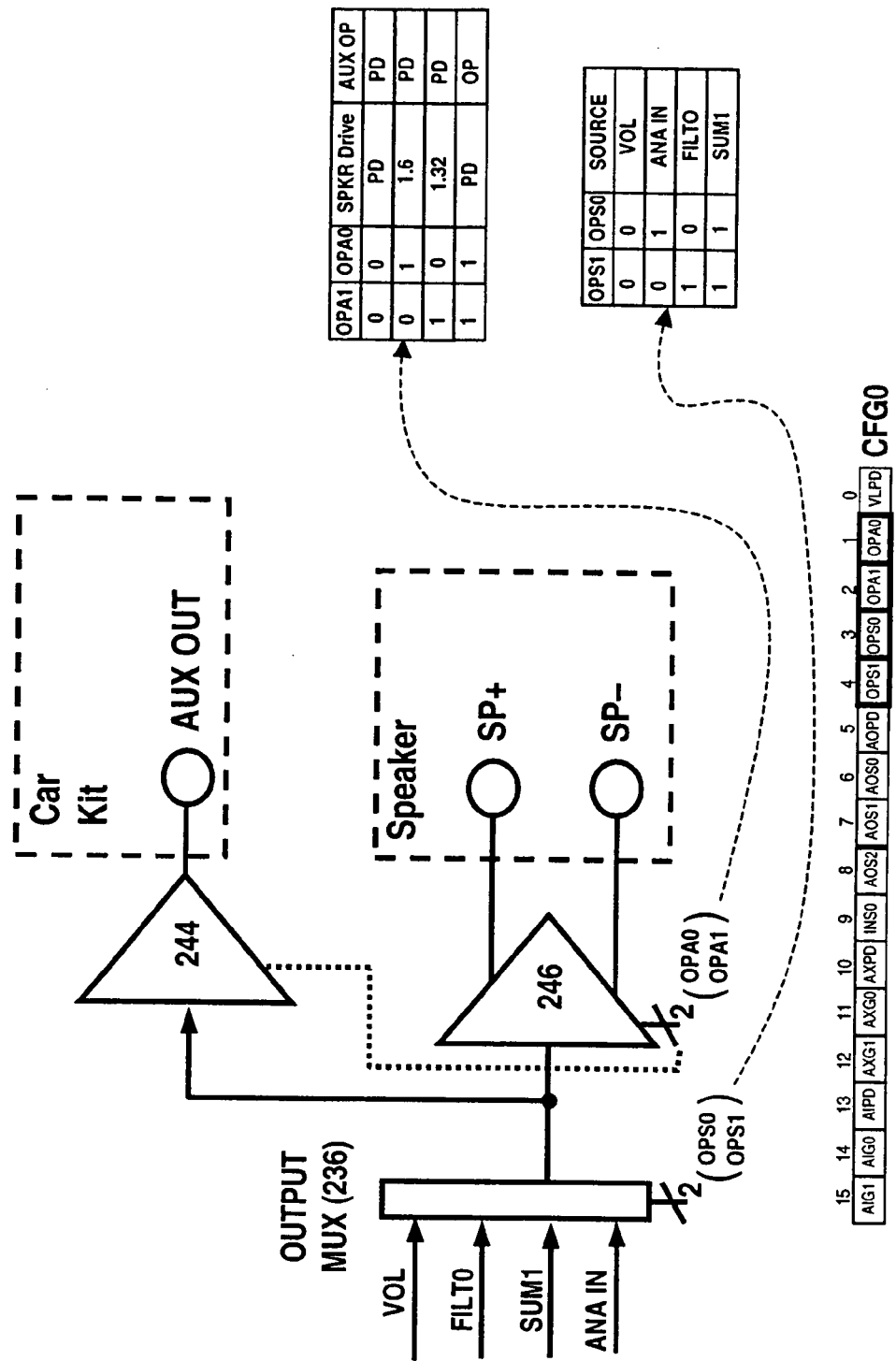

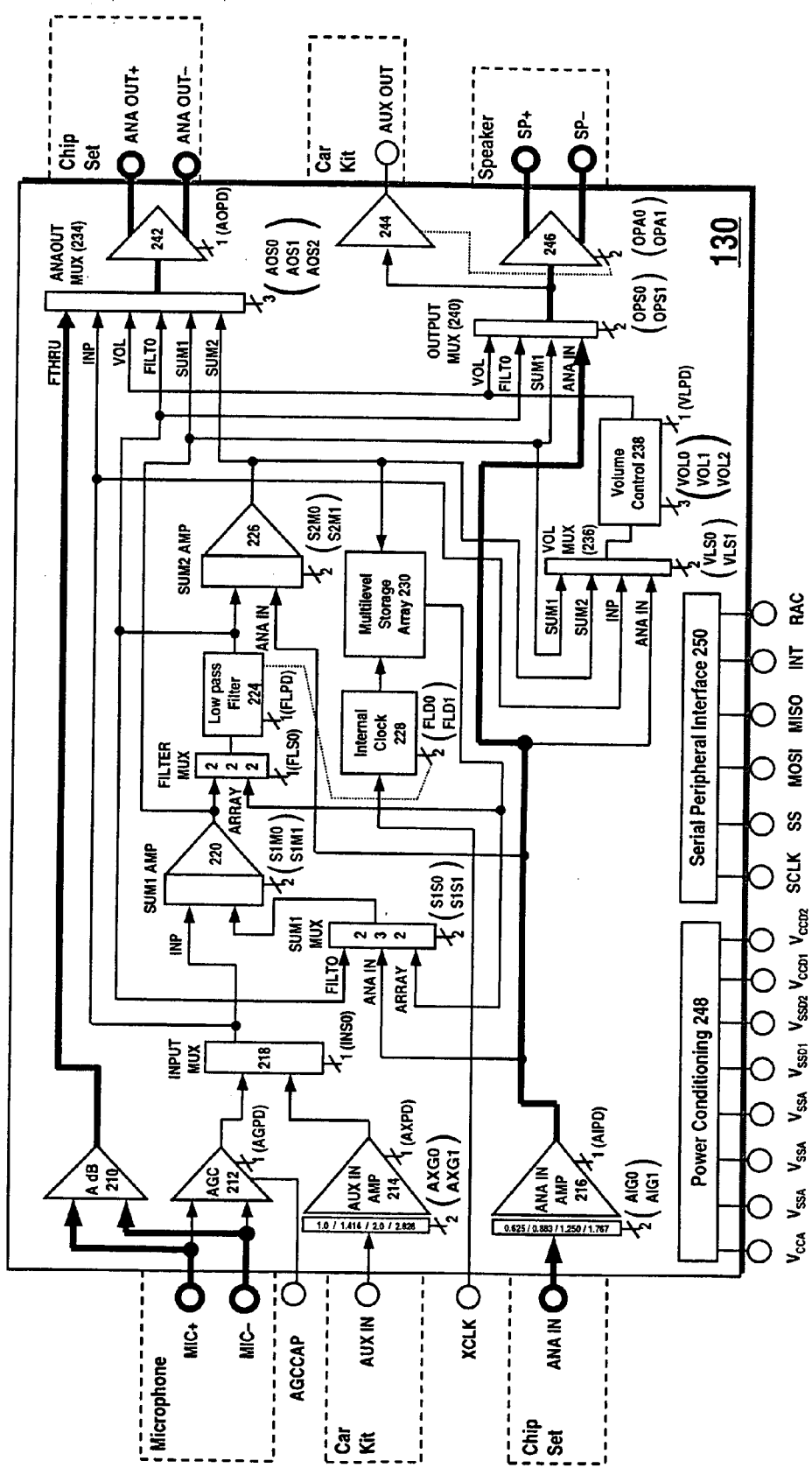

CMD1:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | a | 1 | 0 | 0 | 1 | 0 |

DATA1:

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | b | c | 0 | X | X | 1 | X | 0 | 0 | 0 | 0 | 0 | 1 | 0 | 1 | 1 |

CMD2:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | 1 | 1 | 0 | 1 | 0 | 0 |

DATA2:

| CFG1 | VLS1 | VLS0 | VOL2 | VOL1 | VOL0 | S1S0 | S1S1 | S1M1 | S1M0 | S2M0 | S2M1 | FLS0 | FLD1 | FLD0 | FLPD | AGPD |
|---|---|---|---|---|---|---|---|---|---|---|---|---|---|---|---|---|
| Bit | X | X | X | X | X | X | X | 1 | 1 | 1 | 1 | X | X | X | 1 | 1 |

FIGURE 6B

CMD1

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | a | 1 | 0 | 0 | 1 | 0 |

DATA1

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | X | X | 0 | X | X | 1 | 0 | 0 | 0 | 0 | 0 | 0 | 0 | 0 | 1 | 1 |

CMD2

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | 1 | 1 | 0 | 1 | 0 | 0 |

DATA2

| CFG1 | VLS1 | VLS0 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|---|---|
| Bit | X | X | X | X | X | X | X | 0 | 0 | 1 | 0 | 0 | b | c | 0 | 0 |

CMD3

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 1 | 0 | 1 | 0 | 0 | 1 | 0 | 0 |

ADD

| A10 | A9 | A8 | A7 | A6 | A5 | A4 | A3 | A2 | A1 | A0 |
|---|---|---|---|---|---|---|---|---|---|---|
| 0 | 0 | 0 | 1 | 0 | 1 | 0 | 0 | 0 | 0 | 0 |

FIGURE 7B

CMD1

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | a | 1 | 0 | 0 | 1 | 0 |

DATA1

| CFG0 | VLS1 | VLS0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|---|---|
| Bit | X | X | X | X | 1 | X | X | 1 | X | 1 | 1 | 1 | 0 | X | X | 0 | 0 | 1 |

CMD2

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | 1 | 1 | 0 | 1 | 0 | 0 |

DATA2

| CFG1 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|
| Bit | X | X | X | X | X | X | X | 1 | 1 | 1 | b | c | 0 | 1 |

CMD3

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 1 | 1 | 1 | 0 | 0 | 0 | 0 | 0 |

ADD

| A10 | A9 | A8 | A7 | A6 | A5 | A4 | A3 | A2 | A1 | A0 |
|---|---|---|---|---|---|---|---|---|---|---|
| 0 | 0 | 0 | 1 | 0 | 1 | 0 | 0 | 0 | 0 | 0 |

FIGURE 8B

CMD1:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | a | 1 | 0 | 0 | 1 | 0 |

DATA1:

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | b | c | 0 | X | X | 1 | 1 | 0 | 0 | 0 | 0 | 0 | 0 | 0 | 1 | 1 |

CMD2:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | 1 | 1 | 0 | 1 | 0 | 0 |

DATA2:

| CFG1 | VLS1 | VLS0 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|---|---|
| Bit | 0 | 0 | X | X | 1 | X | 1 | 1 | 0 | 1 | 0 | 0 | d | e | 0 | 0 |

CMD3:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 1 | 0 | 1 | 0 | 0 | 0 | 0 | 0 |

ADD:

| A10 | A9 | A8 | A7 | A6 | A5 | A4 | A3 | A2 | A1 | A0 |
|---|---|---|---|---|---|---|---|---|---|---|
| 0 | 0 | 0 | 1 | 0 | 1 | 0 | 0 | 0 | 0 | 0 |

CMD1:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | a | 1 | 0 | 0 | 1 | 0 |

DATA1:

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | b | c | 0 | X | X | 1 | 0 | 1 | 0 | 0 | 1 | 0 | 0 | 0 | 1 | 0 |

CMD2:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | 1 | 1 | 0 | 1 | 0 | 0 |

DATA2:

| CFG1 | VLS1 | VLS0 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|---|---|
| Bit | 0 | 1 | d | e | f | 0 | 0 | 0 | 1 | 0 | 0 | 0 | g | h | 0 | 0 |

CMD3:

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 1 | 1 | 1 | 1 | 0 | 0 | 0 | 0 |

ADD:

| A10 | A9 | A8 | A7 | A6 | A5 | A4 | A3 | A2 | A1 | A0 |
|---|---|---|---|---|---|---|---|---|---|---|
| 0 | 0 | 0 | 1 | 0 | 1 | 0 | 0 | 0 | 0 | 0 |

FIGURE 11B

CMD1

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | a | 1 | 0 | 0 | 1 | 0 |

DATA1

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | b | c | 0 | X | X | 1 | X | 0 | 0 | 0 | 0 | 0 | 0 | 0 | 1 | 0 |

CMD2

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 0 | X | 1 | 1 | 0 | 1 | 0 | 0 |

DATA2

| CFG1 | VLS1 | VLS0 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|---|---|
| Bit | 0 | 1 | d | e | f | X | X | X | X | X | 0 | 1 | g | h | 0 | 0 |

CMD3

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | X |
| Bit | 1 | 1 | 1 | 0 | 0 | 0 | 0 | 0 |

ADD

| A10 | A9 | A8 | A7 | A6 | A5 | A4 | A3 | A2 | A1 | A0 |
|---|---|---|---|---|---|---|---|---|---|---|
| 0 | 0 | 0 | 1 | 0 | 1 | 0 | 0 | 0 | 0 | 0 |

CMD1

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | a | 1 | 0 | 0 | 1 | 0 |

DATA1

| CFG0 | AIG1 | AIG0 | AIPD | AXG1 | AXG0 | AXPD | INS0 | AOS2 | AOS1 | AOS0 | AOPD | OPS1 | OPS0 | OPA1 | OPA0 | VLPD |
|---|---|---|---|---|---|---|---|---|---|---|---|---|---|---|---|---|
| Bit | b | c | 0 | X | X | 1 | X | X | X | X | 1 | 0 | 0 | 0 | 1 | 1 |

CMD2

| Command bit | C7 | C6 | C5 | C4 | C3 | C2 | C1 | C0 |
|---|---|---|---|---|---|---|---|---|
| Function | RUN | P/R* | PU | IAB | MC | CS1 | CS0 | |
| Bit | 0 | X | 1 | 1 | 0 | 1 | 0 | 0 |

DATA2

| CFG1 | VLS1 | VLS0 | VOL2 | VOL1 | VOL0 | S1S1 | S1S0 | S1M1 | S1M0 | S2M1 | S2M0 | FLS0 | FLD1 | FLD0 | FLPD | AGPD |
|---|---|---|---|---|---|---|---|---|---|---|---|---|---|---|---|---|
| Bit | 0 | 1 | X | X | X | 0 | 0 | 0 | 1 | 1 | 0 | 0 | d | e | 0 | 1 |

FIGURE 12B

MULTIPLE MESSAGE MULTILEVEL ANALOG SIGNAL RECORDING AND PLAYBACK SYSTEM CONTAINING CONFIGURABLE ANALOG PROCESSING FUNCTIONS

This application is a continuation of U.S. patent application Ser. No. 09/184,454, filed Nov. 2, 1998.

BACKGROUND OF THE INVENTION

1. Field of the Invention

The present invention relates generally to the field of integrated circuit design, and specifically, to multilevel analog signal recording and playback systems.

2. Background Information

The ISD 4000 and the ISD 33000 series products of Information Storage Devices, located in San Jose, Calif., represent a 3-volt serial interface family of voice recording and playback devices. These devices only record messages at a single sample rate, giving a fixed duration product. These prior art devices further include singular, fixed interface capability, i.e., a single input of a specified level and a single output of a specified level. In many systems, there are more than one signal source and/or destination. Specifically, in mobile communication systems, signals flow to and from the human interface (microphone and speaker), the baseband processing module, and other interfaces. To provide such a system, many external components are required in order to switch and/or mix signals, and adjust signal levels.

FIG. 1 illustrates a block diagram of a mobile communication system 10 incorporating a prior art analog recording and playback system. The system 10 includes a baseband section 20 that is coupled to a radio frequency section 22, which is in turn coupled to an antenna 24 for transmitting and receiving signals. The baseband section 20 includes a digital signal processor 26 for performing conventional signal processing, a baseband codec 28, and a voiceband codec 30. The voiceband codec is coupled to a microphone 32 and a speaker 34, both of which may be incorporated into a handset, through microphone (MIC+ and MIC−) and speaker (SP OUT+ and SP OUT−) terminals, respectively. The system 40 is coupled to the baseband section 20 for recording messages (memos, or a message from a remote caller) by way of an ANA IN input, and for playing back messages (outgoing messages) by way of the ANA OUT output. A microcontroller 50 is coupled to the baseband section 20 and system 40 for controlling both devices.

As can be seen, the prior art system of FIG. 1 together with other products were designed solely to record or playback an analog signal. They contain no analog processing functions such as signal mixing, gain, or level control. This implies that such functions must be provided by external components, often making implementation of such functions impracticable due to economic and/or physical space constraints.

SUMMARY OF THE INVENTION

The present invention comprises a multilevel analog recording and playback system. The analog recording and playback system is a fully configurable integrated device that provides a variety of analog processing functions to enhance system level integration. In one embodiment, the analog recording and playback system includes a memory array, first and second inputs coupled to first and second input amplifiers, respectively, first and second outputs coupled to first and second output amplifiers, respectively, and a summing amplifier. The summing amplifier is coupled to the memory array and the input and output amplifiers.

The analog recording and playback system optionally includes a microphone automatic gain control ("AGC") circuit, volume control and filtering circuit, speaker driver circuit, gain selectable analog input, auxiliary input and output paths, configurable summation amplifiers having mixing features, and user selectable programming duration.

BRIEF DESCRIPTION OF THE DRAWINGS

FIG. 4C illustrates a mapping of control bits of the configurations registers, according to one embodiment of the present invention.

FIGS. 5A through 5G illustrate close-up views of circuits contained within the analog recording and playback system of the present invention together with configuration register control bits that control the circuits therein.

FIGS. 6A and 6B illustrate the analog recording and playback device of the present invention configured in a feed-through mode and the commands issued to the SPI for configuring the same in the feed-through mode.

FIGS. 7A and 7B illustrate the analog recording and playback device of the present invention configured in a record mode and the commands issued to the SPI for configuring the same in the record mode.

FIGS. 8A and 8B illustrate the analog recording and playback device of the present invention configured in a play outgoing message mode and the commands issued to the SPI for configuring the same in the play outgoing message mode.

FIGS. 9A and 9B illustrate the analog recording and playback device of the present invention configured in a full-duplex record mode and the commands issued to the SPI for configuring the same in the full-duplex record mode.

FIGS. 10A and 10B illustrate the analog recording and playback device of the present invention configured in a full-duplex play mode and the commands issued to the SPI for configuring the same in the full-duplex play mode.

FIGS. 11A and 11B illustrate the analog recording and playback device of the present invention configured in a simplex play mode and the commands issued to the SPI for configuring the same in the simplex play mode.

FIGS. 12A and 12B illustrate the analog recording and playback device of the present invention configured in a voice pager mode and the commands issued to the SPI for configuring the same in the voice pager mode.

DETAILED DESCRIPTION

Figure 1:
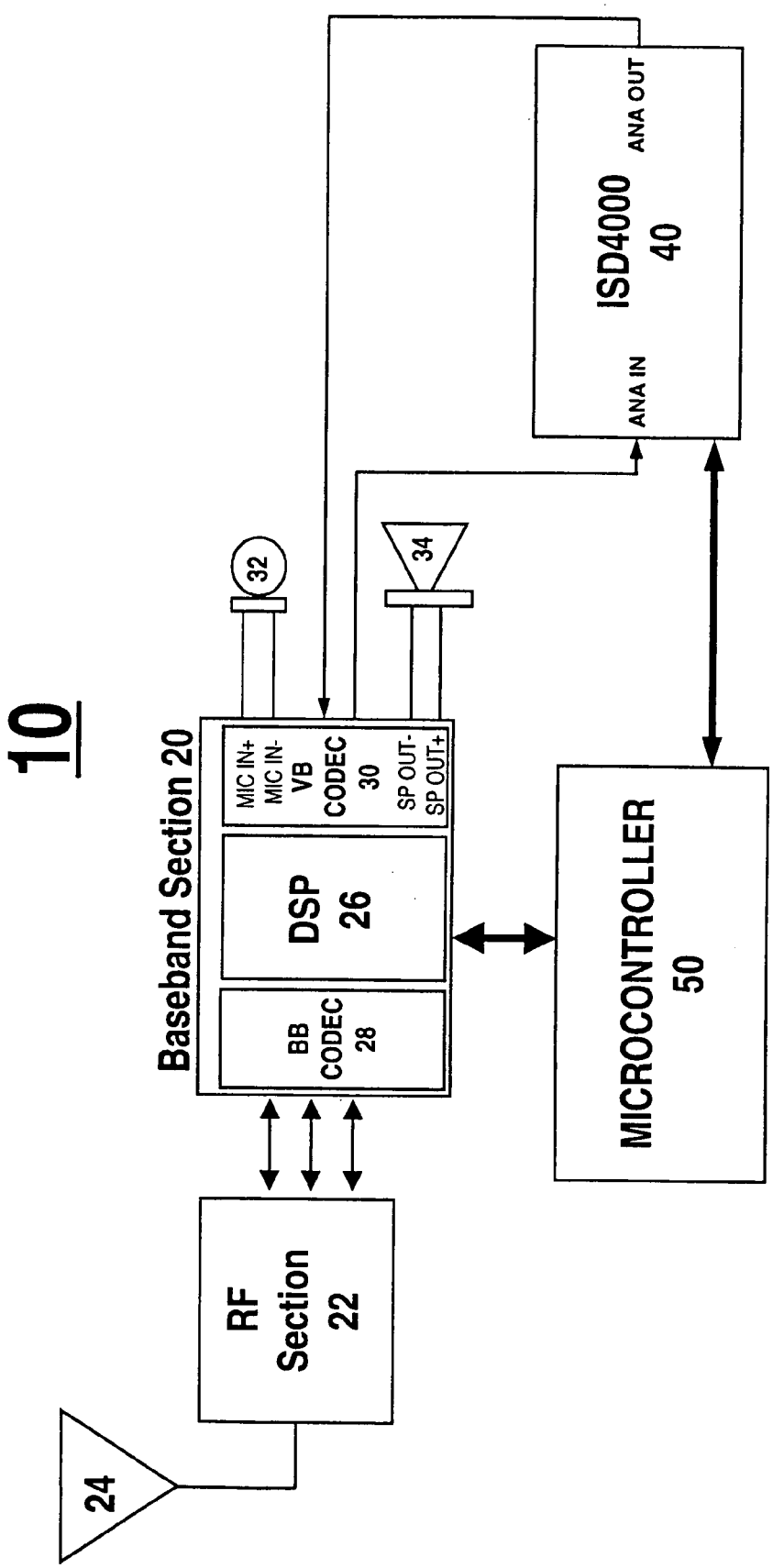
FIG. 1 illustrates a block diagram of a mobile communication system incorporating a prior art analog recording and playback system.

The present invention comprises a multilevel analog recording and playback system, which adds a variety of analog processing functions to the ISD4000 system, thereby enhancing flexibility and system level integration. The basic ISD400 system is described in co-pending U.S. patent application Ser. No. 09/115,442 entitled "Single or Dual Message Multilevel Analog Signal Recording and Playback System Containing Independently Controlled Signal Storage Segments with Externally Selectable Duration Capability", and assigned to the assignee of the present invention, the contents of which are hereby incorporated by reference.

More specifically, the analog recording and playback system of the present invention is a fully configurable integrated device that includes, among other things, a plurality of signal paths, a microphone automatic gain control ("AGC") circuit, volume control and filtering circuit, speaker driver circuit, gain selectable analog input, auxiliary input and output paths, configurable summation amplifiers having mixing features, multilevel analog memory storage array, and user selectable programming duration.

The signal paths are user configurable, providing a flexible platform for steering analog signals through input, output, and various internal paths. The analog signals, which may originate from various sources, can also be stored in the storage array, or analog signals may be played back to multiple outputs. The microphone AGC and speaker driver amplifiers allow direct interface to transducer elements. A high quality, differential analog output is provided to interface to additional audio processing circuitry such as a cellular baseband chip set. A high level, gain selectable analog input amplifier provides an interface to large input signal levels (e.g., a baseband chip set speaker output). Auxiliary input and output paths are provided to interface to alternative signal paths. Configurable summation amplifiers mix multiple signal sources for recording such signal sources simultaneously (e.g., both sides of a telephone conversation), or for playing back such signal sources simultaneously. A volume control circuit allows adjustment of outgoing signal levels to one of a plurality of signal levels.

The analog recording and playback device includes two sixteen-bit configuration registers for establishing signal paths and controlling circuits contained therein. The registers are double buffered in such a way that configuration register zero is not activated until configuration register one is loaded. Configuration register one contains bits most commonly changed (e.g., volume level bits), and can be changed independently of configuration register zero.

In mobile communication applications, the analog recording and playback system of the present invention enables concurrent two-way call record, call screening, playback of a recorded message during a call, voice memo, and an answering machine/call screening function. The analog recording and playback system eliminates the need for additional external components by integrating on chip, analog switches, an AGC circuit, summing amplifiers, a power amplifier for an 8-ohm load, a car kit interface, and a volume control circuit. By allowing the sample rate to be changed, the duration of record operations can also be changed for each recording operation.

Figure 2:
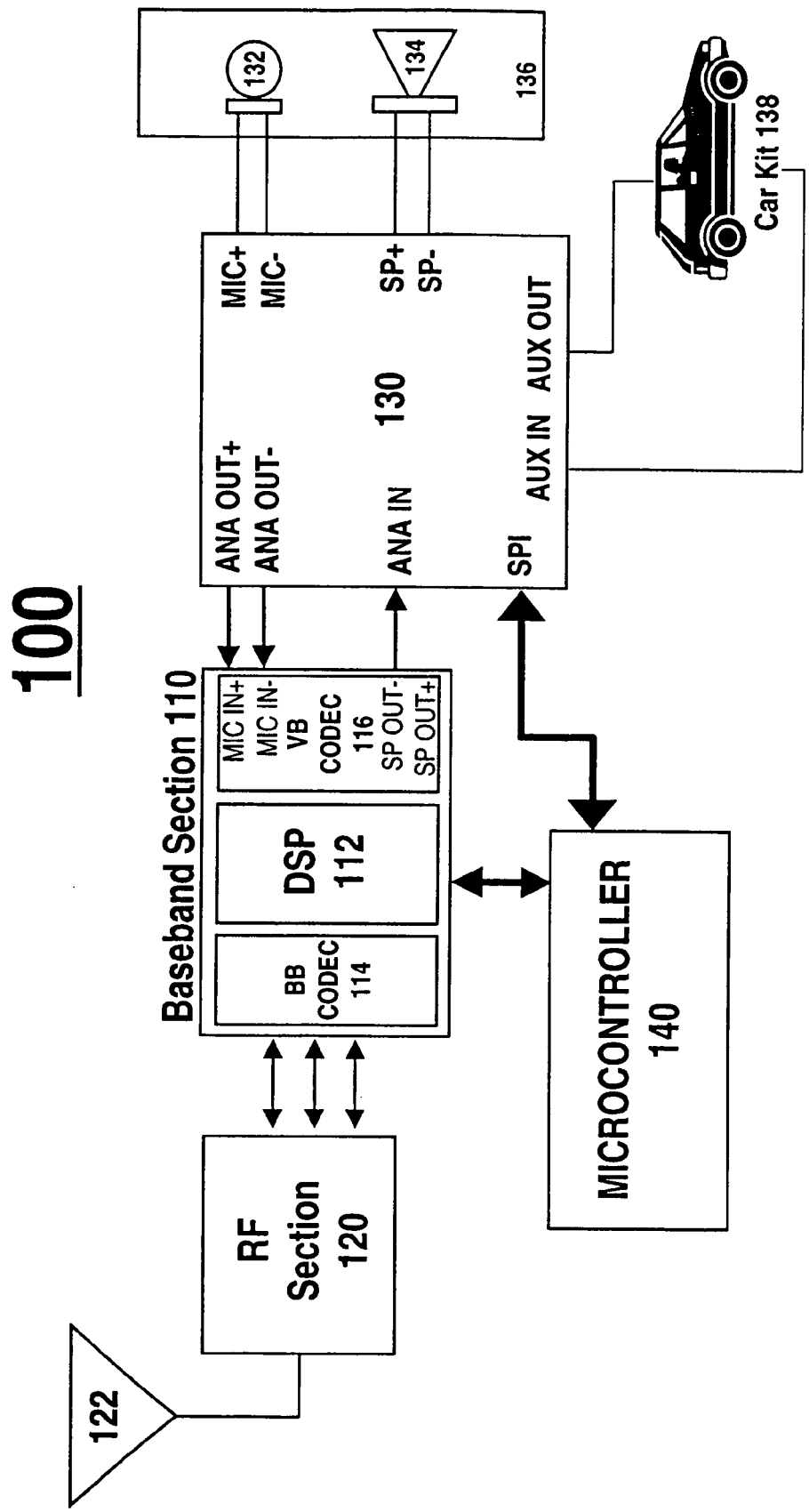
FIG. 2 illustrates an exemplary system incorporating the analog recording and playback system according to one embodiment of the present invention.

FIG. 2 illustrates an exemplary system 100 incorporating an analog recording and playback system 130 according to one embodiment of the present invention. In the embodiment of FIG. 2, the analog recording and playback system 130 is incorporated into a mobile communication system 100. However, in other embodiments, the recording and playback system 130 may be incorporated in, for example, telephone answering machines, cordless telephones, personal recorders, etc., to name a few. Referring to FIG. 2, the mobile communication system 100 includes a baseband circuit 110 coupled to a radio frequency ("RF") interface circuit 120 for transmitting and receiving data by way of antenna 122. The baseband circuit 110 is also coupled to the analog recording and playback device 130 for transmitting and receiving analog signals such as voice signals. The baseband circuit 110 includes a digital signal processor ("DSP") 112 for processing the signals, a baseband coder/decoder ("CODEC") 114 for interfacing with the RF interface circuit 120, and a voiceband CODEC 116 for interfacing to the analog recording and playback device 130 and performing analog-to-digital and digital-to-analog conversions of signals therebetween.

The analog outputs (ANA OUT+ and ANA OUT−) of the device 130 are coupled to the microphone inputs (MIC IN+ and MIC IN−) of the baseband circuit 110, and the speaker output (either SP OUT+ or SP OUT−) of the baseband circuit 110 is coupled to the analog input (ANA IN) of the device 130. The device 130 further includes microphone inputs (MIC+ and MIC−) and speaker outputs (SP+ and SP−) that are coupled to a microphone 132 and a speaker 134, respectively. The microphone 132 and speaker 134 may be incorporated, for example, into a mobile telephone handset 136. Additionally, the device 130 includes an auxiliary input (AUX IN) and output (AUX OUT) for interfacing to, for example, a car kit interface 138 (e.g., the base portion of a mobile communication system that is installed in a vehicle). By way of example, a user may communicate to a remote caller by using the handset 136 or, alternatively, the car kit interface 138. As hereinafter described, downstream refers to communication originating from a remote location that is received from the antenna 122, through the baseband circuit 110, and to the device 130. On the other hand, upstream refers to communication originated from the handset 136 or the car kit interface 138, through the baseband circuit 110 and the antenna 122, and to the remote location.

A microcontroller 140 is coupled to the baseband circuit 110 for controlling the baseband circuit. The microcontroller 140 is also coupled to the analog recording and playback device 130 via an SPI interface, as will be described in more detail below. By way of the SPI interface, the microcontroller 140 controls the device 130, by way of the configuration registers, to operate in various modes, establish various analog paths, and control circuits therein.

Figure 3:
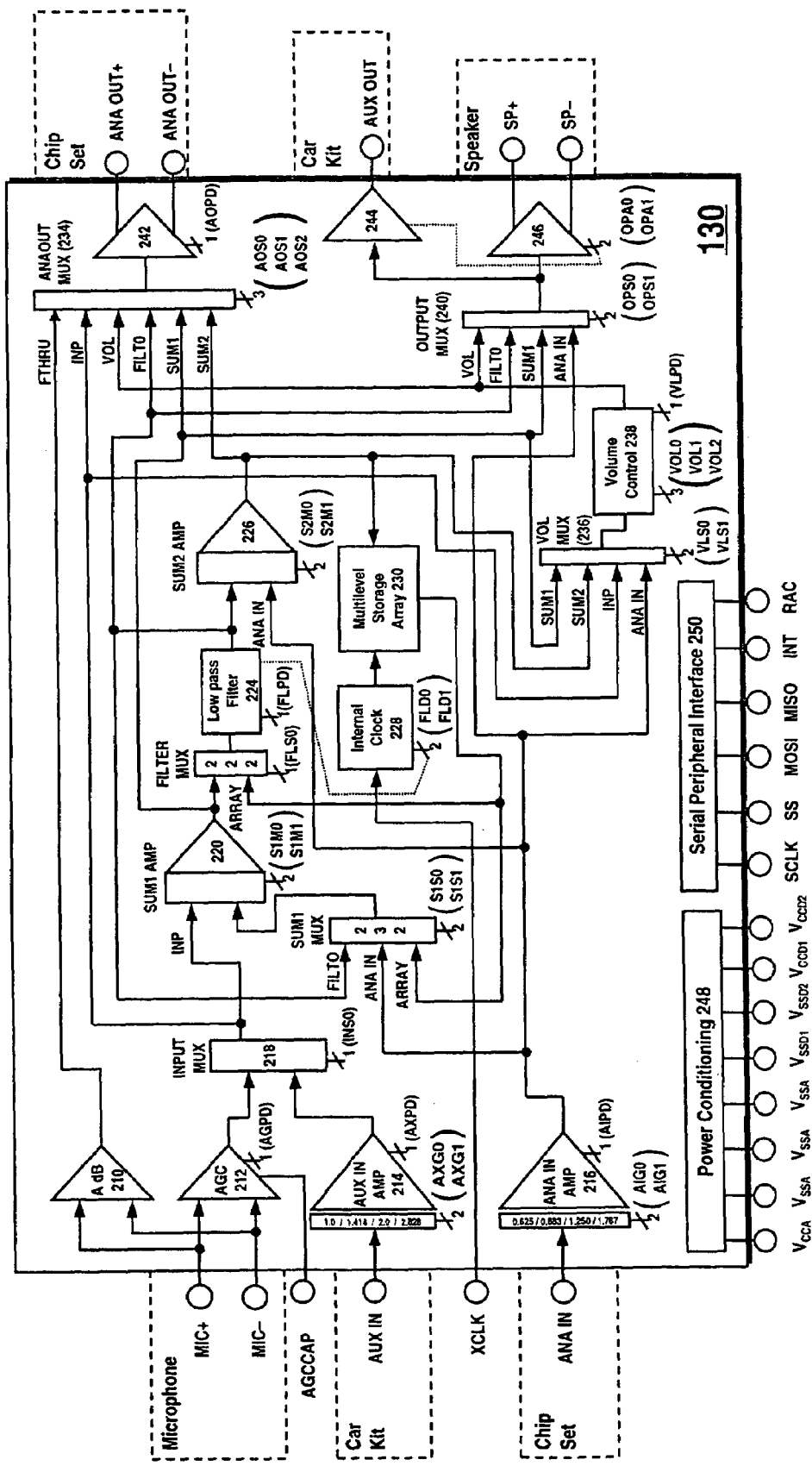
FIG. 3 illustrates a block diagram of the analog recording and playback system of FIG. 2 according to one embodiment of the present invention.

FIG. 3 illustrates a block diagram of the analog recording and playback system 130 of FIG. 2 according to one embodiment of the present invention. In the preferred embodiment, the analog recording and playback device system of the present invention is incorporated into a single integrated circuit package. Referring to FIG. 3, the system 130 includes five major sections, namely, multiple analog input and output paths, two core analog processing sections, a multilevel analog storage array, a serial peripheral interface, and a volume control circuit.

Power is supplied to the analog section, multilevel storage array, and digital section from separate VCC and VSS supply pins. In that regard, care is taken to minimize noise coupling between the analog-and digital sections, not only from the power supplies, but also from the other signals, by way of the block diagram level design, circuit design, physical layout and pin outs, and board level designs utilizing the device. The voltage inputs (VCCA, VCCD1, and VCCD2) and ground inputs (VSSA, VSSD1, and VSSD2) are connected to a power conditioning circuit 248, which supplies regulated power to the circuits within the system 130. In a preferred embodiment, the voltage inputs VCCA and VCCD1–VCCD2 are +3 volts.

To minimize noise, the analog and digital circuits in the system 130 utilize separate power busses. The voltage inputs VCCA and VCCD–VCCD2 supply the analog and digital circuits, respectively. To further minimize noise, the voltage inputs VCCD1 and VCCD2 power separate circuit, where one of the inputs (e.g., VCCD1) powers circuits that generate more noise (e.g., a charge pump circuit), while the other of the inputs (e.g., VCCD2) powers circuits that generate less noise. The ground inputs VSSA (three pins) and VSSD1–VSSD2, which are connected to the analog and digital circuits, respectively, are connected through a low-impedance path to power supply ground.

The system 130 includes a serial peripheral interface ("SPI") 250 that controls the circuits contained within the system 130. The system 130 is configured to operate as a peripheral slave device, with a microcontroller (see, e.g., microcontroller 140 of FIG. 2) controlling the system through the SPI 250. Read/Write access to all the internal circuits of the system 130 is provided by way of the SPI 250.

Figure 4A:
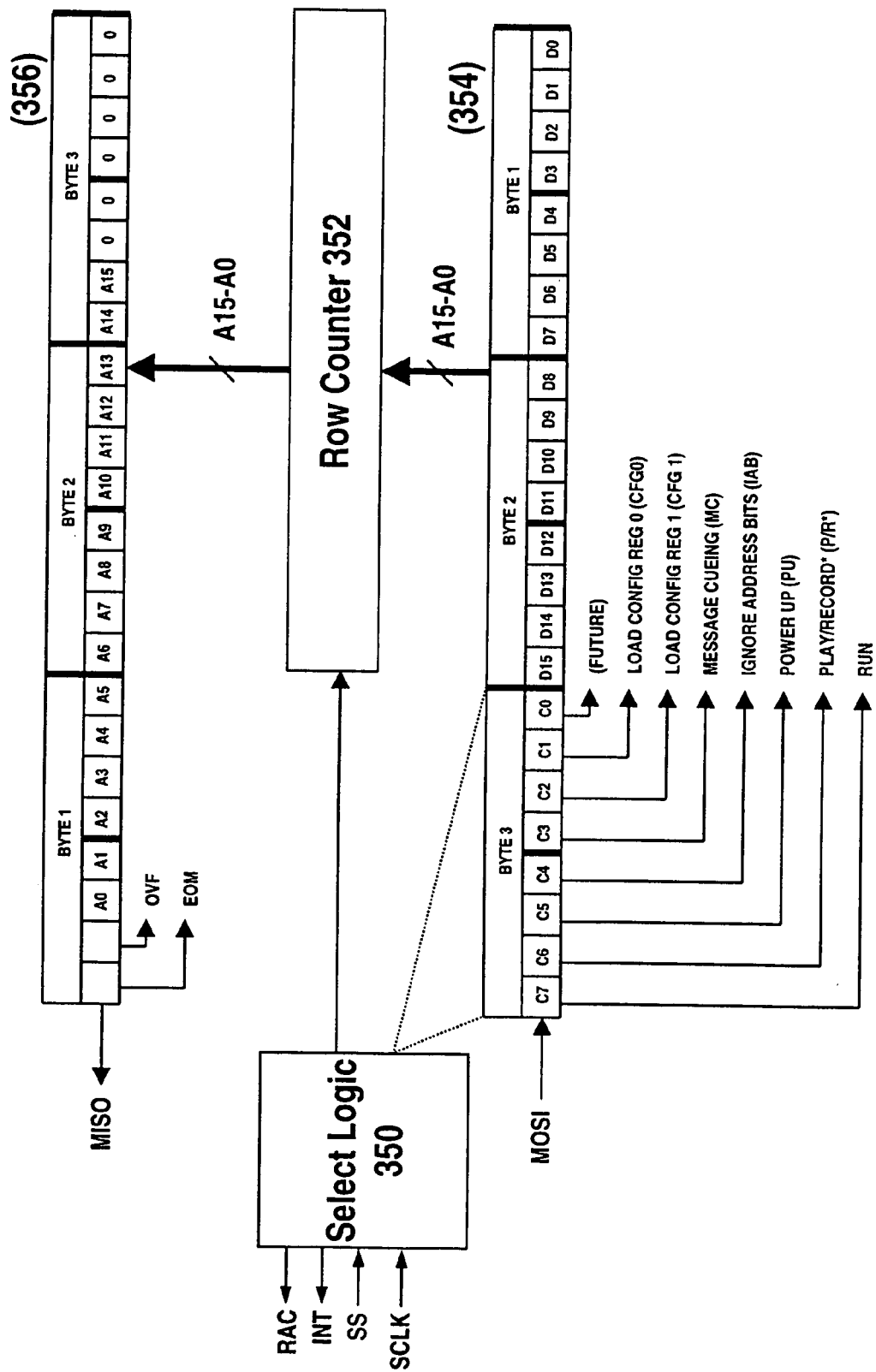
FIG. 4A illustrates a block diagram of a portion of the SPI, according to one embodiment of the present invention.

FIG. 4A illustrates a block diagram of a portion of the SPI 250 according to one embodiment of the present invention. The SPI 250 includes a select logic 350, row counter 352, input shift register 354, and an output shift register 356. The input shift register 354 is coupled to the MOSI pin and receives serial input data from the master device (e.g., microcontroller 140 of FIG. 2). The microcontroller 140 may be any microprocessor including a general-purpose microprocessor, an embedded controller, a single-chip microcontroller, or a complete microprocessor system. The output shift register 356 is coupled to the MISO pin for transmitting serial output data to the master device. The row counter 352 receives address inputs A15–A0 from the input shift register 354 (when IAB=0). This address is used to playback or record at address A15–A0, depending on the command. The row counter also provides the current address A15–A0 of the memory array pointer to the output shift register 356.

In particular, the SCLK and SS inputs coupled to the select logic 350, Master Out Slave In ("MOSI") input coupled to the input shift register 354, and Master In Slave Out ("MISO") output coupled to the output shift register 356 allow a master device (e.g., a microcontroller) to communicate with and check the status of the device 130. The SCLK signal is the clock input to the device. It is generated by the master device and is used to synchronize data transfers in and out of the device through the MOSI and MISO terminals, respectively. The SS signal, when LOW, selects or activates the SPI 250. The MOSI input is a serial data input to the SPI 250, while the MISO output is the serial data output of the device 130. This output goes into a high-impedance state if the device 130 is not selected.

The select logic 350 of the SPI 250 generates interrupt signal (INT) and row access clock ("RAC") outputs for handshaking purposes. The INT output is an open-drain output which is activated (pulled low) when the system reaches an end of message ("EOM") marker in play or when the memory array is full (an overflow "OVF" condition). Each operation that ends in an EOM or OVF will generate an interrupt, indicating the end of a record, playback, or message cueing cycle. The interrupt is cleared the next time an SPI cycle is initiated.

The RAC output is an open drain output that provides a signal with a 200 ms period at 8 kHz sampling frequency. This represents a single row of memory cells within the storage array 230. In one embodiment, the storage array 230 of the device 130 includes 1200 rows of memory cells. The signal remains HIGH for 175 ms and stays LOW for 25 ms when it reaches the end of a row. This pin may be used for implementation of message management techniques.

Figure 4B:
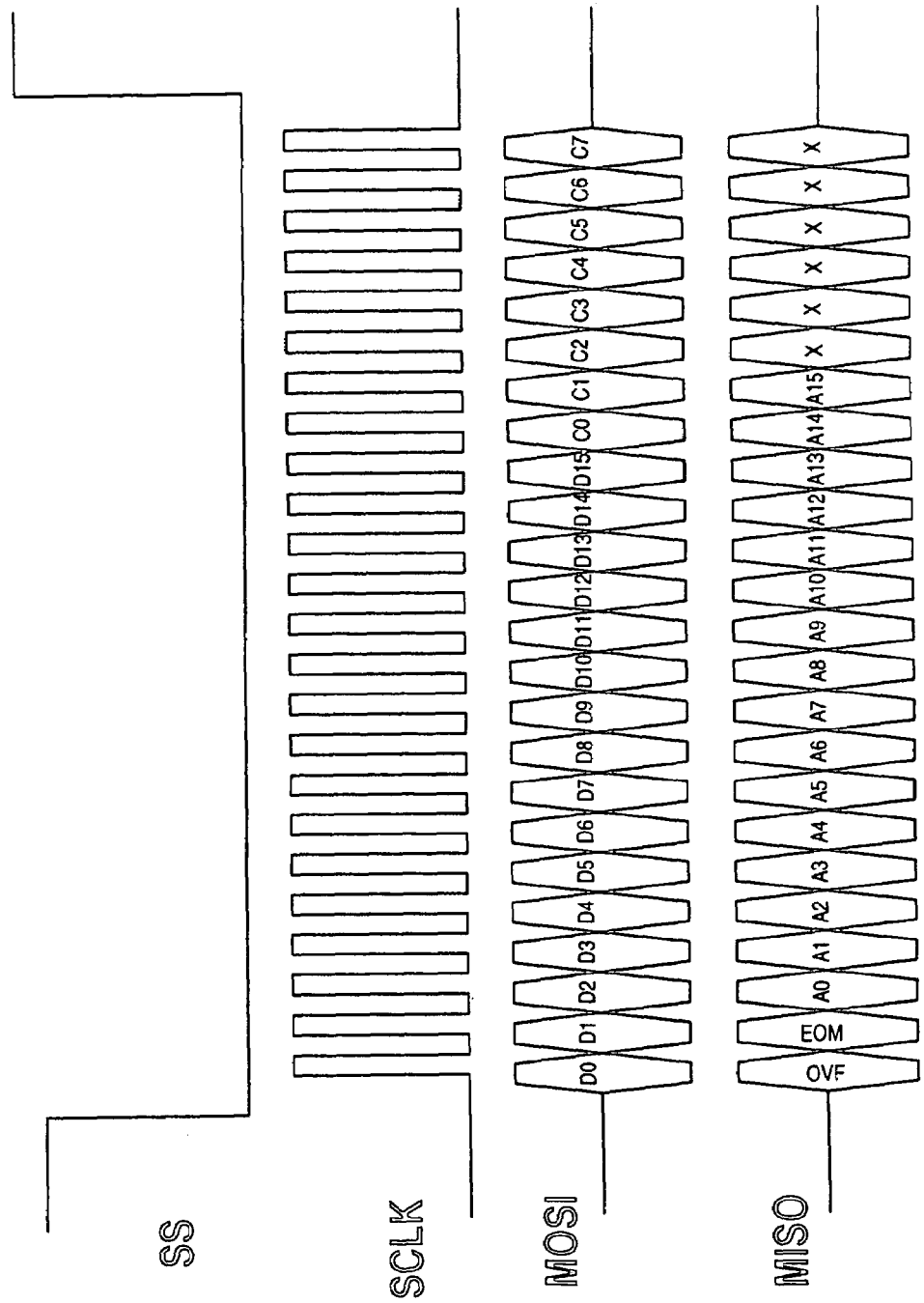
FIG. 4B is an exemplary timing diagram illustrating the timing of various signals received or generated by the SPI.

FIG. 4B is an exemplary timing diagram illustrating the timing of various signals received or generated by the SPI 250. All serial data transfers begin with the falling edge of the SS signal. The SS signal is held LOW during all serial communications and held HIGH between instructions. In this exemplary embodiment, the SS input signal is held LOW for 24 serial clock (SCLK) periods. During this time, data (OVF, EOM, A0–A10) is serially read out from the device, and data (D0–D15 and C0–C7) is serially written into the device. Data is latched into the device 130 on the rising edge of the SCLK signal, and shifted out on the falling edge of the SCLK signal. The master device places data on the MOSI line one-half cycle before the SCLK clock edge.

Referring back to FIG. 4A, the command format, in the preferred embodiment, is three bytes long comprising a control byte (C7–C0) followed by two data bytes (D15–D0). Control bit C7 is the RUN control bit, C6 is the play/record control bit (P/R*), C5 is the power up/down control bit (PU), C4 is the Ignore Address control BitS (IAB), C3 is a message cueing bit (MC), C2 is the configuration register one (CS1) control bit, C1 is the configuration register zero (CS0) control bit, and C0 is reserved for future use. Bits D15–D0 are the address of the row decoder 352 or the data to be stored in the configuration registers, depending on the IAB bit. Table 1 shows the operation summary of the control bits.

TABLE 1

| Instruction | Control bit | Operational Summary |
| --- | --- | --- |
| RUN (C7) | | Enable or Disable an operation |
| = | 1 | Start |
| = | 0 | Stop |
| P/R* (C6) | | Selects Play or Record Operation |
| = | 1 | Play |
| = | 0 | Record |
| PU (C5) | | Master power control |
| = | 1 | Power-Up |
| = | 0 | Power-Down |
| IAB (C4) | | Ignore address control bit |
| = | 1 | Ignore input address (D15–D0) |
| = | 0 | Use the input address register contents for an operation (A15–A0) |
| MC (C3) | | Message Cueing |
| = | 1 | Enable message cueing |
| = | 0 | Disable message cueing |
| CS1/0 (C2, C1) | | Access to Configuration Registers |
| CS1 = | 1 | Access to Configuration Register One (CFG1) |
| CS0 = | 1 | Access to Configuration Register Zero (CFG0) |
| D15–D0 | | Data Bits |

Message cueing is started at a specified address (bits D0–D15 are loaded into row counter 352) with the IAB bit active (IAB=0) or at the current address with the IAB bit inactive (IAB=1). When the message cueing bit C3 is set, the user can skip through messages without knowing the actual physical location of the messages. This operation is used during playback. In this mode, the messages are skipped many times faster than in normal playback mode. In a preferred embodiment, the messages are skipped 1600 times faster than in normal playback mode. Message cueing terminates when an EOM marker is reached. Then, the internal address counter will point to the next message. A summary of the instructions sent by a master device to the SPI 250, along with the corresponding operations, is provided in Table 2.

TABLE 2

| Instruction | Control bits C7–C1 | Operational Summary |
|---|---|---|
| POWER UP | 0010000 | Power Up. Device will be ready for an operation after a power up delay period (Tpud). |
| SETREC | 1010000 | Initiate recording starting at the address A15–A0. |
| STOPPWRDN | 0x01x00 | Stop an operation and Power Down. |
| STOP | 0x11000 | Stop Record or Playback operation. |
| SETPLAY | 1110000 | Start Playback at address A15–A0. |
| REC | 1011000 | Start Record at the next available address. |
| SETMC | 1110100 | Initiate Playback and Message Cueing (MC) at the address specified by A15–A0. |
| MC† | 1111100 | Initiate a Playback and Message Cueing at the next available address. |
| PLAY | 1111000 | Play at the next available address (ignore address bits). |
| RINT†† | 0x11000 | Read Interrupt status bits: Overflow and EOM. |
| LOAD CFG1 | 0xx1010 | Load configuration register one. This command is followed by two bytes of data. |
| LOAD CFG0 | 0xx1001 | Load configuration register zero. This command is followed by two bytes of data. |

†Message cueing can be selected only at the beginning of play operation.
††As the interrupt data is shifted out of the device 130, control and address data is being shifted in. The interrupt command should be compatible to the current command if there is no change to the device operation.

The control bits C7–C0 are provided from the input shift register 354 to the select logic 350. Upon latching the control data from the input shift register 354, the select logic 350 generates control signals that are distributed internally to various circuits within the device 130 to control power-down, recording/playing operation, message cueing, and the IAB. The select logic 350 receives additional inputs from internal signals such as low VCC detect ("LOVCC") and Power on Reset ("POR").

An internally generated clock signal is used to synchronize these inputs and to prevent the control circuit from entering a metastable state which locks up the device 130. In one embodiment, a power-up time of 25 ms is provided to allow all the bias generators and capacitors to reach their quiescent point.

The INT signal and the status bits (EOM and OVF) are generated by the select logic 350. The INT signal is cleared after the status has been read by the microcontroller 140 (FIG. 2). The internal operation of the device 130 does not depend on the time at which the interrupt was cleared. By way of example, when the device 130 is in the play mode and encounters an EOM marker, the device 130 stops playing and generates an interrupt. Similarly, when the device 130 is in overflow, indicating that a record, playback, or message cueing cycle has reached the end of the last row in the storage array 230 (FIG. 3), the device 130 generates an interrupt and stops the operation.

In implementing the flexible message management system of the present invention, three criteria must be met. First, a scheme for reading the address of the row pointer must be provided. Second, a flag for detecting the end of the current row must be provided. Third, the ability to load a new address (from the address register at the end of the current row, instead of incrementing the row pointer to the subsequent row) must be provided.

To accomplish these, first, the status bits EOM and OVF, and the address of the row pointer (A15–A0) are shifted out of the output shift register 346 via the MISO pin, during an SPI transfer. Second, the RAC signal provides for early detection of an end of a current row. As an example, for an 8 kHz sample rate, the maximum duration of a message in one row having 1600 cells is 200 ms. The RAC signal stays high (output held high by an external pull-up resistor) for 175 ms and changes to a low state for 25 ms. This waveform is periodic, and it tracks the sample rate of the internal 512 kHz oscillator and continues as long as the system 130 is recording or playing. Thirdly, the IAB bit in the control register 354 controls the manner in which the row counter 352 is loaded. If the IAB bit is set ("1"), the row address increments to the following row at the end of the current row. If the IAB bit is reset ("0"), a new address is loaded into the row address counter 352. This new address is the content of bits D15–D0 of the input shift register 354. The select logic 350 generates the appropriate control signals based on the value of the IAB bit.

FIG. 4C illustrates a mapping of control bits of the configurations registers, according to one embodiment of the present invention. These control bits control various signal paths, circuits, and controls within the analog recording and playback system 130. Loading of the configuration registers is as follows: If configuration register zero ("CFG0") is to be modified, a load CFG0 command byte and two data bytes are transmitted to the input shift register 354. The two data bytes are then transferred to CFG0. Next, configuration register one is loaded by transmitting a load CFG1 command byte and two data bytes to the input shift register 354. Once the data is shifted in, the two data bytes are transferred to CFG1. This latter command must be loaded into the device regardless of whether CFG1 is to be changed or not because changes to CFG0 do not take effect until CFG1 is loaded. The control bits in the configuration registers are grouped such that CFG0 contains parameters that are rarely changed. On the other hand, the control bits in the CFG1 contains parameters that are more likely to be changed. Thus, for the loaded values of CFG0 to take effect, CFG1 must be loaded. The parameters in CFG1 take effect immediately after CFG1 is loaded.

As will be described in more detail below, in one embodiment, there are five types of configuration bits. A first type includes power down bits which mask the global power down bit (C5) to select the blocks within the device to be powered up/down. The other types of configuration bits include MUX select bits for controlling the routing of analog paths within the device, sum select bits for controlling summing amplifiers, sample rate select bits for establishing the sample rate of the analog recording and the cut-off frequency of a filter, and volume level bits for setting the attenuation level of a volume control circuit.

Referring back to FIG. 3, the device 130 comprises various signal inputs paths, namely, a microphone input path (microphone inputs MIC+ and MIC−), an auxiliary input path (AUX IN), and an analog input path (ANA IN). The microphone inputs MIC+ and MIC− are coupled to amplifiers 210 and 212. FIG. 5A illustrates a close-up view of the amplifiers 210 and 212 and the control bit in CFG1 that controls amplifier 212. Referring to FIGS. 3 and 5A, the microphone input (MIC+ and MIC−) has two separate paths. The first path is a feed-through path (FTHRU) and involves the amplifier 210, which has a fixed gain of A dB, where "A" is a positive number (e.g., 6 dB gain). The amplifier 210 is a high quality amplifier for passing an analog signal to the output of the device 130 without alteration or storage of the analog signal. This analog signal is passed to the baseband circuitry 110 of FIG. 2 for transmission upstream. This feed-through path will be described in more detail below.

The second path, involving amplifier 212, is mainly used internally for storing an analog signal. The amplifier 212 includes automatic gain control ("AGC") feedback for producing a fixed signal level, which can then be stored in the multilevel analog storage array 230. An AGPD control signal line is coupled to the amplifier 212 for powering the amplifier up/down. Bit 0 of CFG1 controls the AGPD control signal. Also coupled to the amplifier 212 is an AGCCAP signal line which performs a peak detect function for both the AGC during record and the auto-mute feature during playback.

Figure 5B:
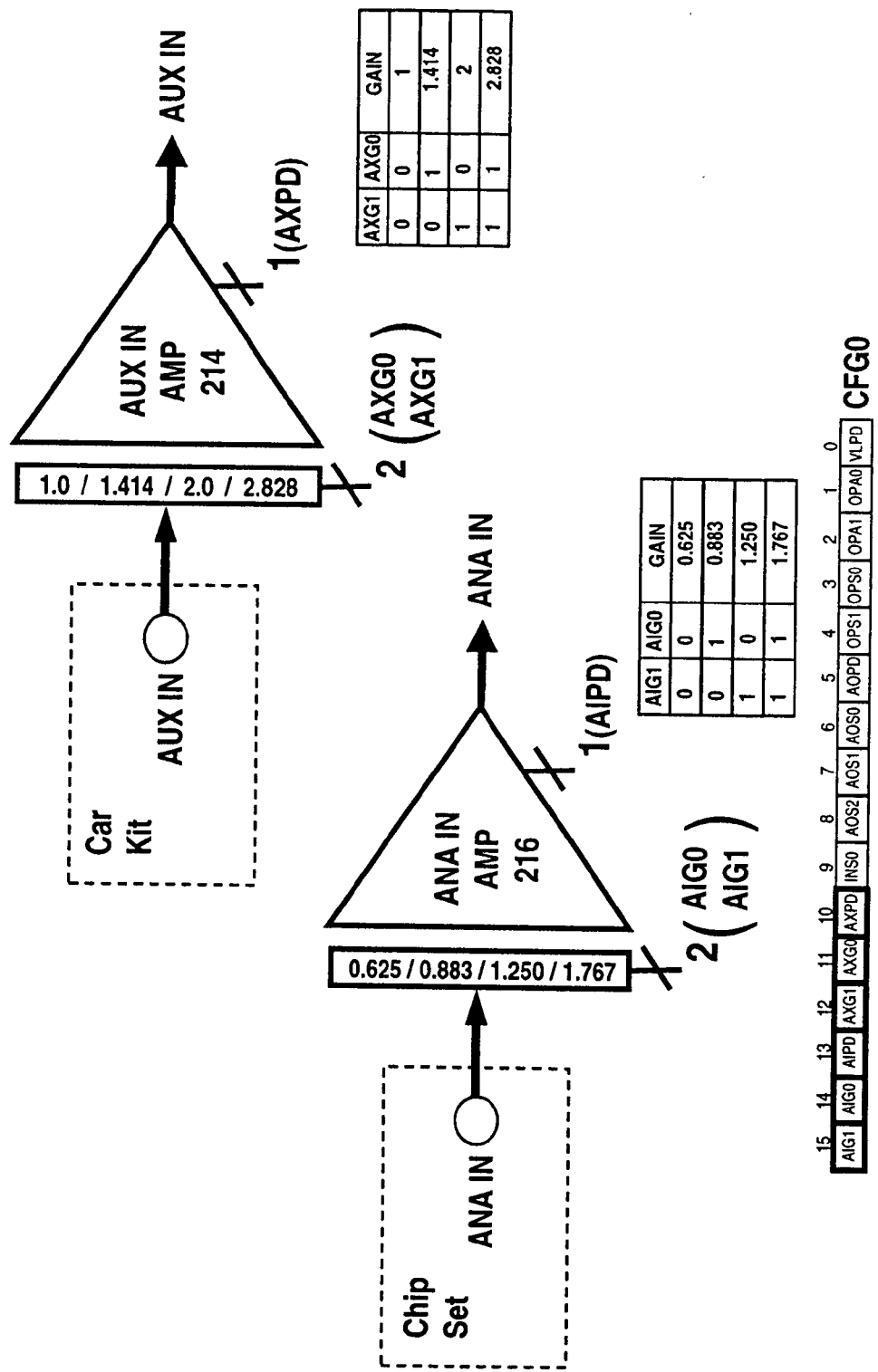

FIG. 5B illustrates the auxiliary input (AUX IN) and analog input (ANA IN) paths, and the bits in the CFG0 relating thereto. The auxiliary input AUX IN is coupled to variable gain amplifier 214 and the analog input ANA IN is coupled to variable gain amplifier 216. Variable gain amplifiers 214 and 216 are independently configurable, by setting bits in CFG0, to provide one of a plurality of gain levels. In the preferred embodiment, each amplifier is configurable to one of four gain levels, although a different number of gain levels may be provided. This allows the inputs to interface to a wide variety of signal levels. In particular, the auxiliary input AUX IN is designed to interface to a car kit interface (e.g., a signal on the order of hundreds of millivolts). The two signal lines AXG0 and AXG1, which are controlled by bits 11 and 12 of CFG0, control the gain of the amplifier 214. The analog input ANA IN is designed to interface to a baseband chip (e.g., a speaker driver output) or other high signal levels. The signal lines AIG0 and AIG1 control the gain of amplifier 216, which are controlled by bits 14 and 15 of CFG0.

In the preferred embodiment, the gain levels for amplifier 214 are 1, 1.414, 2, and 2.828, and the gain levels for amplifier 216 are 0.625, 0.883, 1.250, and 1.767, as shown in the chart of FIG. 5B. It is to be appreciated that other gain levels may be used depending on the input source level. An auxiliary input power down signal (AXPD) is coupled to the variable gain amplifier 214 for powering up/down the same. Bit 10 of CFG0 controls the power up/down state of amplifier 214. Similarly, an analog input power down signal (AIPD) is coupled to the variable gain amplifier 216 for powering up/down the same. Bit 13 of CFG0 controls the power up/down state of amplifier 216.

Figure 5C:
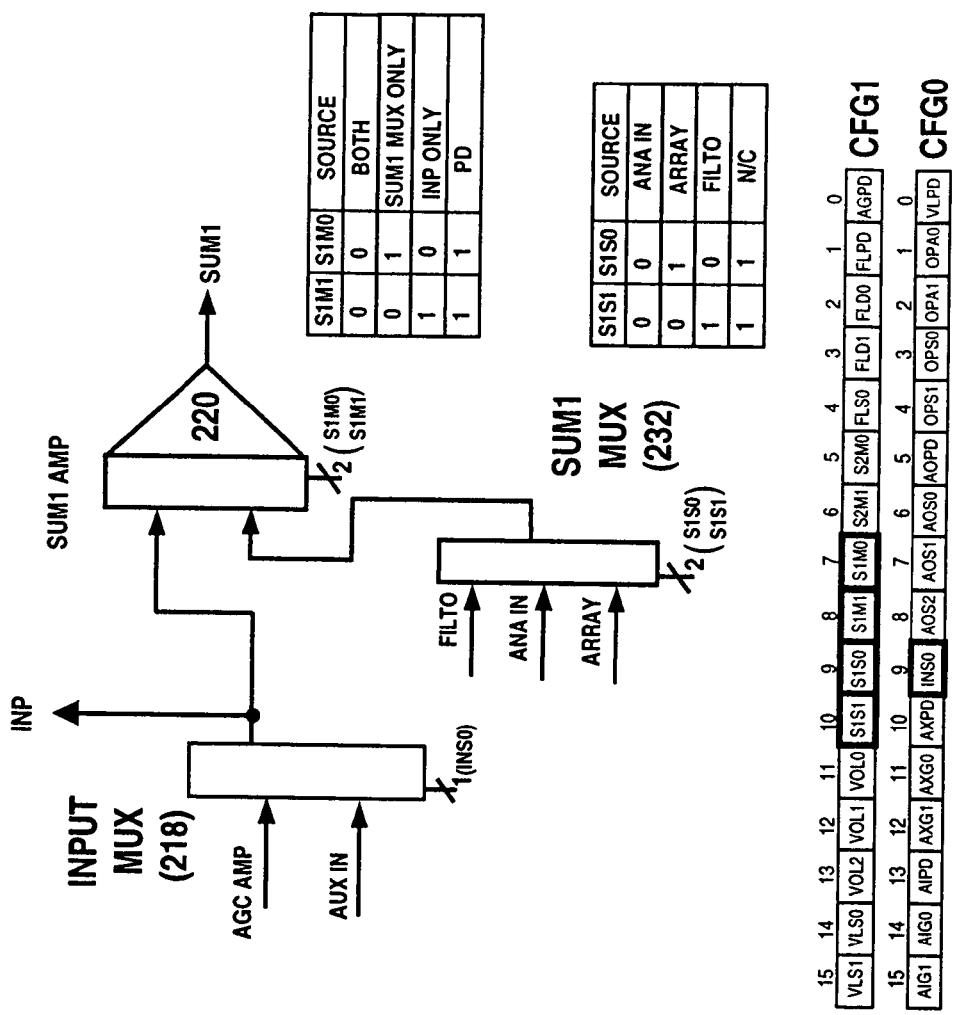

Referring now to FIG. 5C, a first core portion of the analog recording and playback system 130 of the present invention may be seen. The first core portion includes an input source multiplexer (INPUT MUX) 218, a first summing multiplexer (SUM1 MUX) 232, and a first summing amplifier (SUM1 AMP) 220. Referring to FIGS. 3 and 5C, the INPUT MUX 218 receives inputs AGC AMP and AUX IN from the AGC amplifier 212 and the variable gain amplifier 214, respectively. A control signal INS0, which is controlled by bit 9 of CFG 0, selects the input (i.e., the input source) that is passed to the output of the INPUT MUX 218. The INPUT MUX 218 is coupled to a first input of SUM1 AMP 220. The SUM1 MUX 232, which is a secondary source selector, selects one of three inputs that is passed to the output. The inputs include the ANA IN input from the variable gain amplifier 216, an ARRAY input (which is an output of the storage array 230), and a FILTO input (output of a low pass filter 224). The ARRAY input is a direct output of the storage array 230, and the FILTO is a filtered output of, for example, the storage array 230, as will be described in FIG. 5D. Control signals S1S0 and S1S1 determine the output of the SUM1 MUX 232, responsive to bits 9 and 10, respectively, of CFG 1.

The SUM1 MUX 232 is coupled to a second input of the SUM1 AMP 220. The SUM1 AMP 220 is a summing amplifier that operates in various modes. Control signals S1M0 and S1M1, responsive to bits 7 and 8, respectively, of CFG1, control the mode of the SUM1 AMP 220. In a first mode, the SUM1 AMP 220 mixes the inputs coupled thereto to provide a mixed analog output signal. In a second mode, the SUM1 AMP 220 operates as a buffer, passing one or the other input to the output. In a third mode, the SUM1 AMP 220 is in a power down condition. A chart showing the operating modes of the SUM1 AMP 220 is shown in FIG. 5C.

FIG. 5D illustrates a second core portion of the analog recording and playback system 130 of the present invention. The second core portion includes a filter multiplexer (FILTER MUX) 222, a low pass filter 224, a second summing amplifier (SUM2 AMP) 226, an internal clock circuit 228, and a multilevel analog storage array 230. This second core portion mainly involves recording and/or playback of analog signals. Referring to FIGS. 3 and 5D, the inputs to the FILTER MUX 222 include the SUM1 input (output of SUM1 AMP 220) and the ARRAY input (output of the storage array 230). Control signal FLS0, which is controlled by bit 4 of CFG1, determines the output of the FILTER MUX 222. The FILTER MUX 222 is coupled to the low pass filter 224 which is used for anti-aliasing and smoothing analog signals passing therethrough. Control signal FLPD, which is controlled by bit 1 of CFG1, is coupled to the low pass filter 224 for powering up/down the same. The output (FILTO) of the low pass filter 224 is coupled to a first input of the SUM2 AMP 226. The output of the variable gain amplifier 216 is coupled to a second input of the SUM2 AMP 226.

Figure 10A:
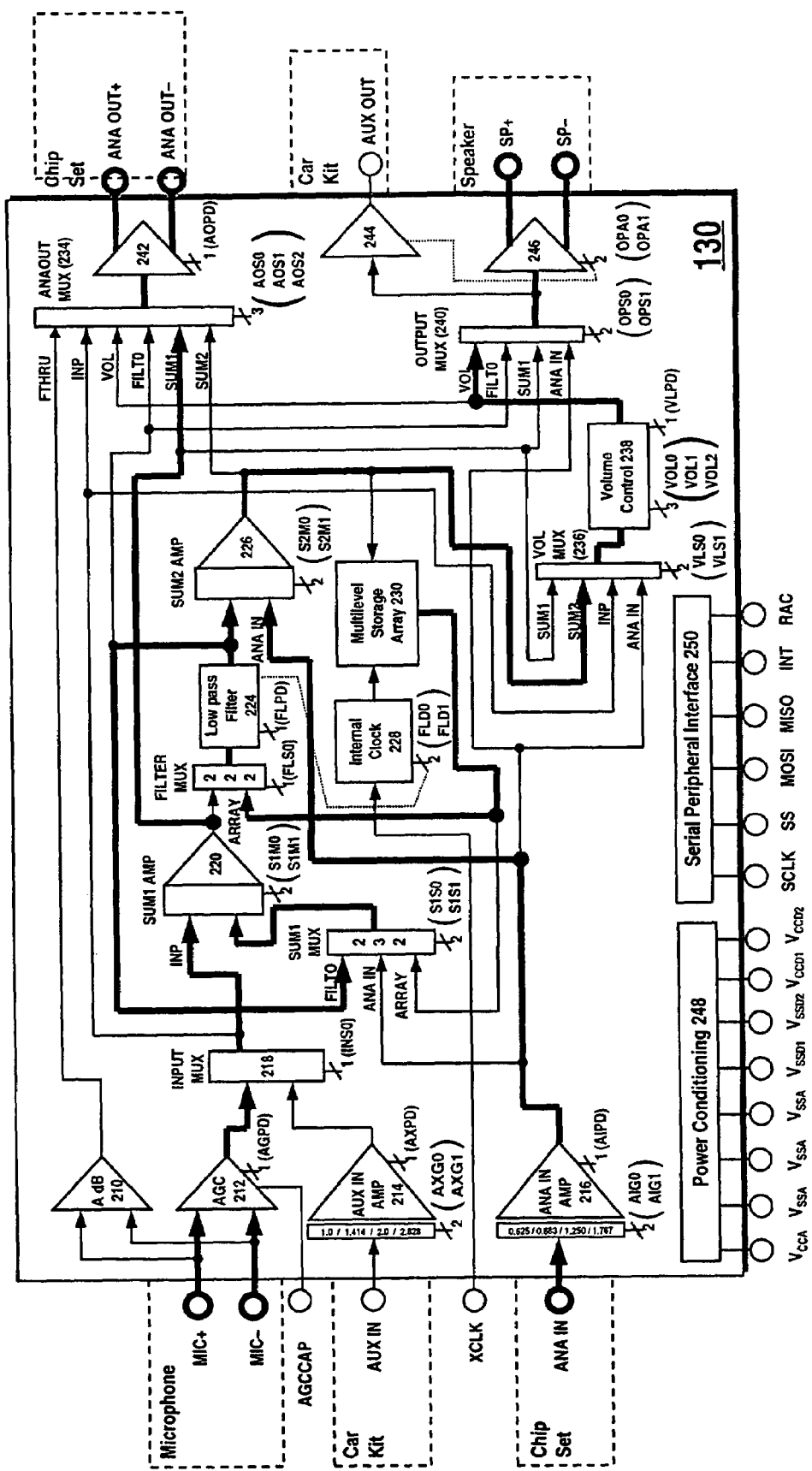

Similar to the SUM1 AMP 220, the SUM2 AMP 226 operates in various modes, responsive to control signals S2M0 and S2M1 coupled thereto. The control signals are controlled by bits 5 and 6 of CFG1. In a first mode, the SUM2 AMP 226 mixes the inputs coupled thereto to provide a mixed analog output signal. In a second mode, the SUM2 AMP 226 operates as a buffer, passing one or the other input to the output. In a third mode, the SUM2 AMP 226 is in a power down condition. A chart showing the operating modes of the SUM2 AMP 226 is shown in FIG. 5D. One instance, where both summing amplifiers SUM1 AMP 220 and SUM2 AMP 226 are used for mixing signals, involves a situation where a user, who is on the telephone with a remote caller, plays a recorded message (stored in the storage array 230) to the remote caller (FIG. 10A). This scenario, among numerous other scenarios, will be described in more detail below.

The SUM2 AMP 226 is coupled to the multilevel analog storage array 230. The recording technique, column drivers, and corresponding circuitry of the storage array 230 are substantially identical to the storage array described in co-pending application Ser. No. 09/115,442. In one embodiment, the storage array 230 includes 1200 rows and 1600 columns of analog storage cells. Each storage cell stores one of a plurality of discrete voltage levels (e.g., 256 levels).

Clocking of the storage array 230 is derived either from an internal oscillator or, alternatively, from an external clock coupled to the XCLK pin. The clock sets the sample rate of the storage array. Control bits FLD0 and FLD1, which are controlled by bits 2 and 3 of CFG1, are coupled to the internal clock 228 to set the sample rate. In one embodiment, the internal clock 228 provides one of four sample rates (e.g., 4, 5.3, 6.4, or 8 kHz). Other sample rates may be provided, depending on design choice. The control bits FLD0 and FLD1 are also coupled to the low pass filter 224 for changing the cut-off frequency as the sample rate changes.

For example, in an answering machine application, a high quality 8 kHz sample rate is used for an outgoing message, and a lower quality sample rate (e.g., 4 kHz) is used for incoming messages to increase the amount of recording time available. The incoming messages can also be stored as high quality. However, if the free memory space decreases, the sample rate of the storage array 230 can be adaptively changed to maximize the remaining free storage space. Each new message starts at the beginning of a new row, so that each message can have a different sample rate.

Figure 5E:
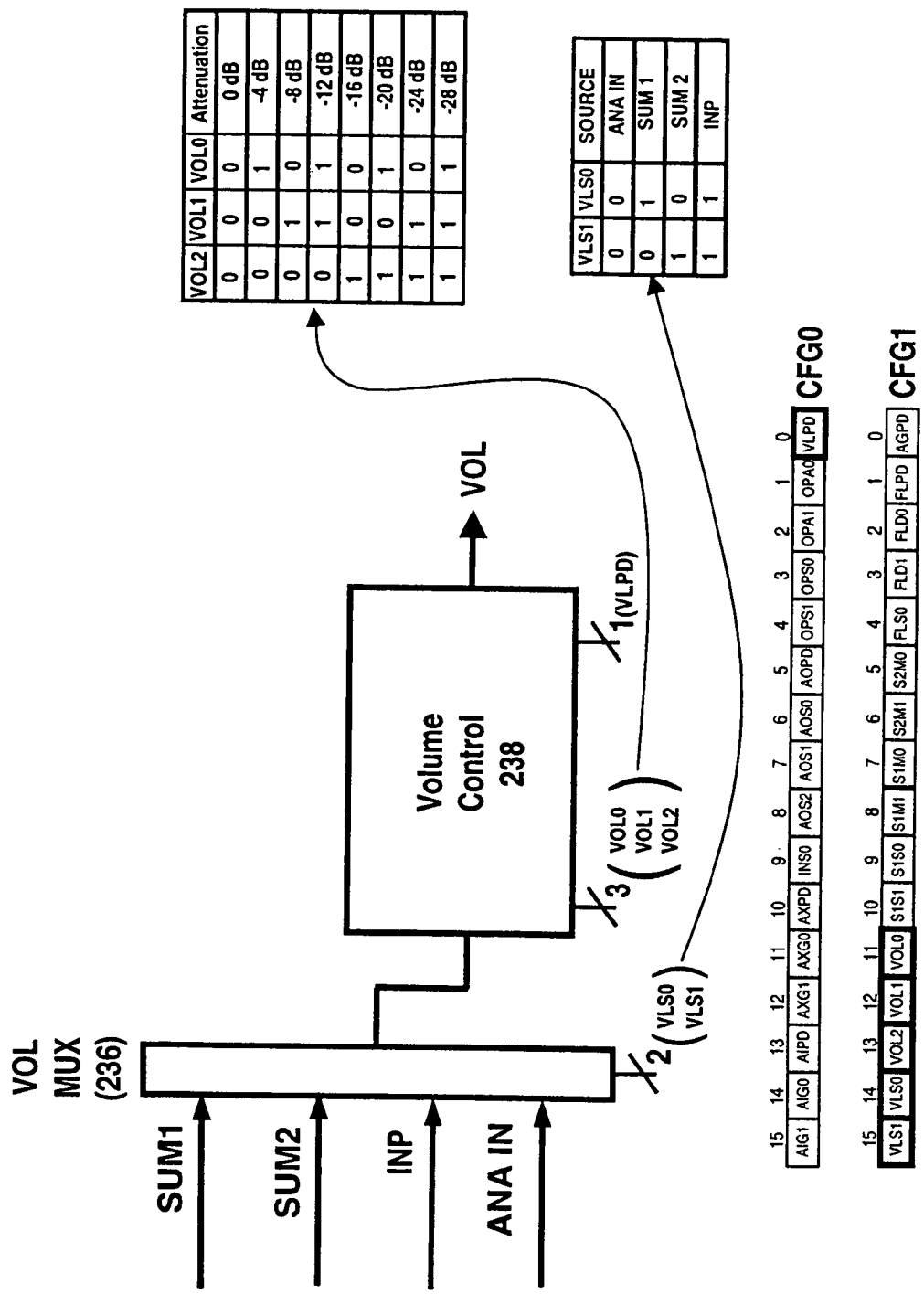

FIG. 5E illustrates a volume control circuitry of the analog recording and playback system 130. This circuit includes a volume multiplexer (VOL MUX) 236 and a volume control circuit 238. Referring to FIGS. 3 and 5E, control signals VLS0 and VLS1, controlled by bits 14 and 15 of CFG1, are coupled to the VOL MUX 236 for selecting one of four possible inputs as an output. The inputs to the VOL MUX 236 include SUM1 (output of SUM1 AMP 220), SUM2 (output of SUM2 AMP 226), INP (output of INPUT MUX 218), and ANA IN (output of variable gain amplifier 216). The VOL MUX 236 is coupled to the volume control circuit 238. Control signals VOL0–VOL2 are coupled to the volume control circuit 238, responsive to corresponding bits 11–13 of CFG1. The control signals VOL0–VOL2 control the attenuation factor of analog signals provided to the input of the volume control circuit 238 (e.g., one of eight volume levels). A VLPD signal, controlled by bit 0 of CFG0, is also coupled to the volume control circuit 238 to power down/up the same.

Figure 5F:
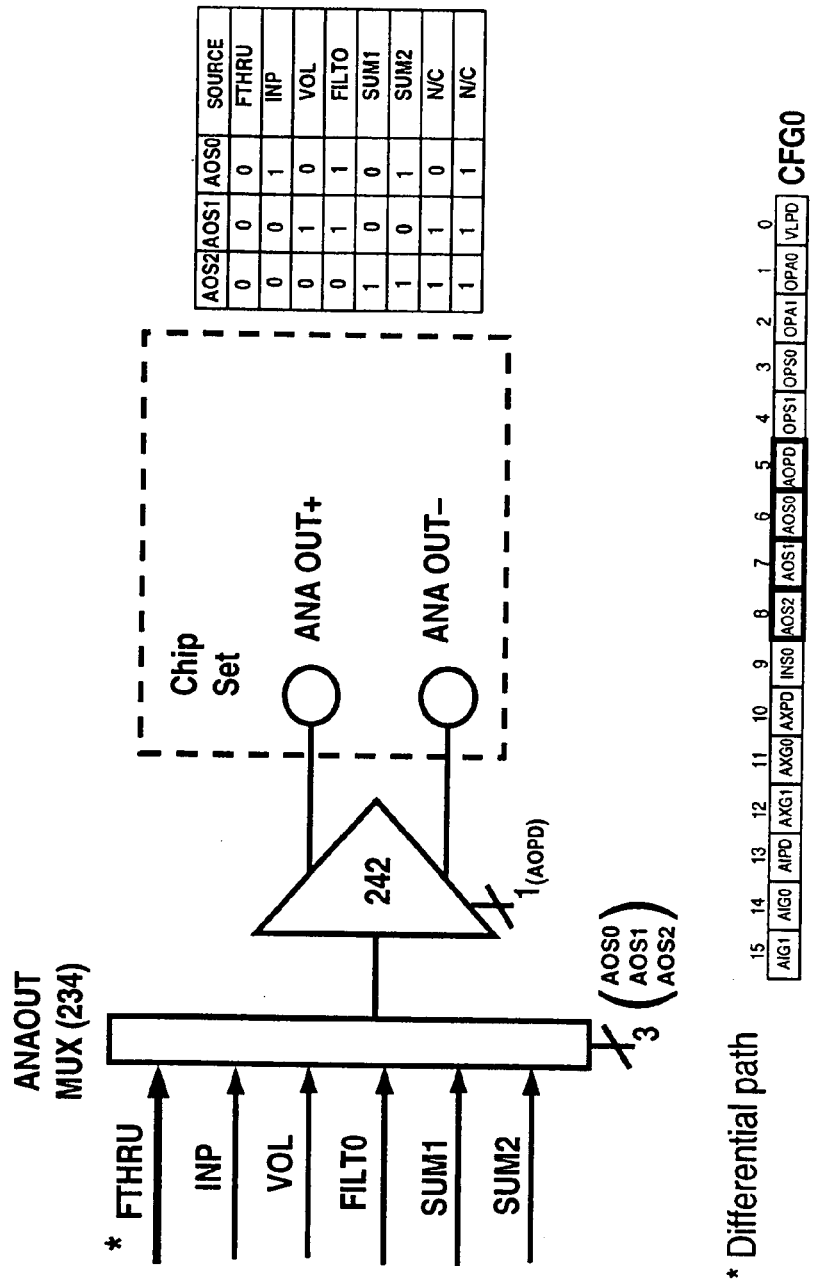

FIG. 5F illustrates a first output path of the analog recording and playback system 130 according to one embodiment of the present invention. The first output path includes an analog output multiplexer (ANAOUT MUX) 234 and an output amplifier 242. Referring to FIGS. 3 and 5F, the signals coupled to the ANAOUT MUX 234 include FTHRU (output of amplifier 210), INP (output of INPUT MUX 218), VOL (output of volume control circuit 238), FILTO (output of low pass filter 224), SUM1 (output of SUM1 AMP 220), and SUM2 (output of SUM2 AMP 226). Control signals AOS0–AOS2, responsive to corresponding bits 6–8 of CFG0, determine the output of the ANAOUT MUX 234. The amplifier 242 amplifies the analog signal at its input and provides a balanced fully differential output. The amplifier 242 is coupled to the microphone inputs (MIC+ and MIC−) of the baseband circuitry 110 of FIG. 2. Control signal AOPD is coupled to the amplifier 242 for powering up/down the same. Bit 5 of CFG0 controls the state of the AOPD control signal.

FIG. 5G illustrates second and third output paths of the analog recording and playback system 130 of the present invention. Included are an output multiplexer (OUTPUT MUX) 236, variable gain amplifier 244, and speaker driver amplifier 246. Referring to FIGS. 3 and 5G, the signals coupled to the OUTPUT MUX 236 include VOL, FILTO, SUM1, and ANA IN. Control signals OPS0 and OPS1, responsive to bits 3 and 4 of CFG0, determine the output of the OUTPUT MUX 236. The analog signal at the output of the OUTPUT MUX 236 is either driven by the amplifier 244 or the speaker driver amplifier 246. Control signals OPA0 and OPA1, responsive to bits 1 and 2 of CFG0, are coupled to the amplifiers 244 and 246 to control the output path of the analog signal. If both the control bits are high, then amplifier 244 is operational to drive the analog signal to an auxiliary output (e.g., a car kit interface), and amplifier 246 is powered down. If the control bits (OPA0–OPA1) are "01" or "10", then amplifier 246 is operational at gains of 1.6 or 1.32, respectively, to drive a speaker (e.g., in a handset), and amplifier 244 is powered down. The two different gain levels are provided for driving different outputs, and may be modified or changed depending on design choice and the transducer to be driven. If both bits are low, then both amplifiers are powered down.

The circuits contained within the device 130 have been described in detail above. Now, several exemplary signal paths and modes of operation are described to illustrate the flexibility, features, and appreciation of the present invention. It must be noted that the examples described below are not exhaustive of operating modes and signal paths, as various other operating modes and signal paths exit.

FIG. 6A illustrates the analog recording and playback device 130 configured in a feed-through mode according to one embodiment of the present invention. The most basic operation of the device 130 is the feed-through mode, where a user communicates with a remote caller without the device recording, playing back, or mixing the analog signals flowing therethrough. Referring to FIG. 6A, the analog signal paths are shown having highlighted lines. In this mode of operation, the affected circuits include the high-quality amplifier 210, ANAOUT MUX 234, amplifier 242, variable gain ANA IN AMP 216, OUTPUT MUX 240, and speaker driver amplifier 246. The analog signal of the user, received at the microphone inputs MIC+ and MIC−, passes through the amplifier 210, ANAOUT MUX 234, and amplifier 242 to the analog outputs ANA OUT+ and ANA OUT−. The analog signal is received at the microphone inputs MIC IN+ and MIC IN− of the baseband circuit 110 (FIG. 2), which transmits the analog signal upstream to the remote caller. The remote caller's analog signal flows downstream and is received at the ANA IN input of the device 130. This analog signal passes through variable gain amplifier 216, OUTPUT MUX 240, and speaker driver amplifier 246 which drivers a speaker (e.g., in a handset).

In an alternative embodiment, the user's analog signal may be received at the AUX IN input rather than the microphone input, and the remote caller's analog signal may be routed to the AUX OUT output. The AUX IN input and AUX OUT output may include a car kit interface (e.g., speaker phone and microphone). In this alternative embodiment, the user's analog path includes the AUX IN AMP 214, INPUT MUX 218, ANAOUT MUX 234, and amplifier 242, while the remote caller's analog path includes the ANA IN AMP 216, OUTPUT MUX 240, and amplifier 244.

FIG. 6B illustrates the commands issued to the SPI 250 for configuring the device 130 in the feed-through mode. In this mode, both configuration registers are loaded. Referring to FIG. 6B, the first command includes a command byte CMD1 and two bytes of data DATA1 for loading in CFG0. The letter "a" in the C5 field of CMD1 indicates that the bit is set if the device is already active, but left cleared if the device is powered down. The letters "b" and "c" in the AIG1 and AIG0 fields of DATA1 indicate that these value are set to produce an internal signal level of Y-mV peak-to-peak, where in one embodiment Y is 500. The second command includes a command byte CMD2 and two bytes of data DATA2 for loading in CFG1. The letter "X" indicates "don't care" values. Once CFG1 is loaded, the device is configured in the feed-through mode.

Figure 7A:
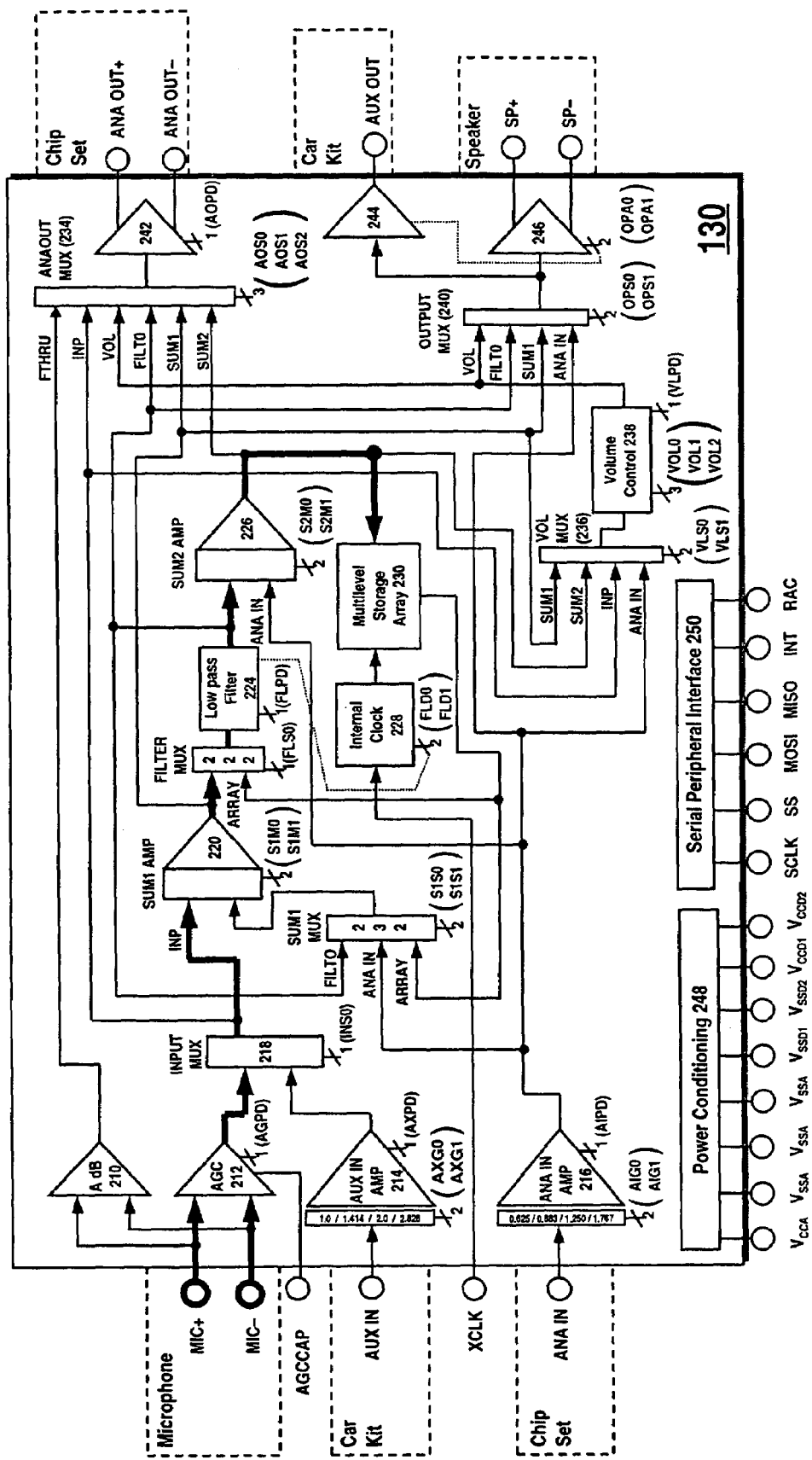

FIG. 7A illustrates the analog recording and playback device of the present invention configured in a record mode. This mode is a simple record operation of an analog signal (e.g., a user) from the microphone inputs MIC+ and MIC−.

This mode allows the device 130 to be used to record messages, memos, notes, etc. As shown in FIG. 7A, the analog signal path is shown having highlighted lines. The affected circuits include the AGC amplifier 212, INPUT MUX 218, SUM1 AMP 220, FILTER MUX 222, low pass filter 224, SUM2 AMP 226, and storage array 230. The analog signal is received by the AGC amplifier 212, which produces a fixed signal level. The fixed level analog signal is passed through the INPUT MUX 218, SUM1 AMP 220, and FILTER MUX 222 to the low pass filter 224. The low pass filter 224 anti-aliases and smoothes the fixed level analog signal. The analog signal then passes through SUM2 AMP 226 and to the storage array 230. The technique for storing the analog signal is described in application Ser. No. 09/115,442.

Alternatively, the analog signal may be recorded from the AUX IN input rather than the microphone input. A variation of the record mode involves recording an analog signal at the ANA IN input. This variation involves recording a message of a remote caller (e.g., an answering machine operation) in a mobile application or pure answering machine application. In this application, the remote caller leaves a message for a local user, who is not present, or the local user is recording the remote caller's analog signal while talking to the remote caller. The circuits affected include the variable gain amplifier 216, SUM1 MUX 232, SUM1 AMP 220, FILTER MUX 222, low pass filter 224, SUM2 AMP 226, and storage array 230.

FIG. 7B illustrates the commands issued to the SPI 250 for configuring the device 130 in the record mode (from MIC+ and MIC− inputs) at address 0A0 (Hex). The record mode involves three commands, a first command to load configuration register zero, a second command to load configuration register one, and a third command to commence recording at a particular address (row) in the storage array 230. Referring to FIG. 7B, the first command includes a command byte CMD1 followed by two bytes of data DATA1 for modifying CFG0. The second command includes a command byte CMD2 followed by two bytes of data DATA2 for modifying CFG1. The letters "b" and "c" in the FLD1 and FLD0 fields are set to establish the sampling rate for recording. The first and second commands establish the analog path. A third command, including a command byte CMD3 and an address ADD, commences the record operation at address 0A0(Hex). The IAB bit in CMD3 is low to indicate that the following data is an address.

Figure 8A:
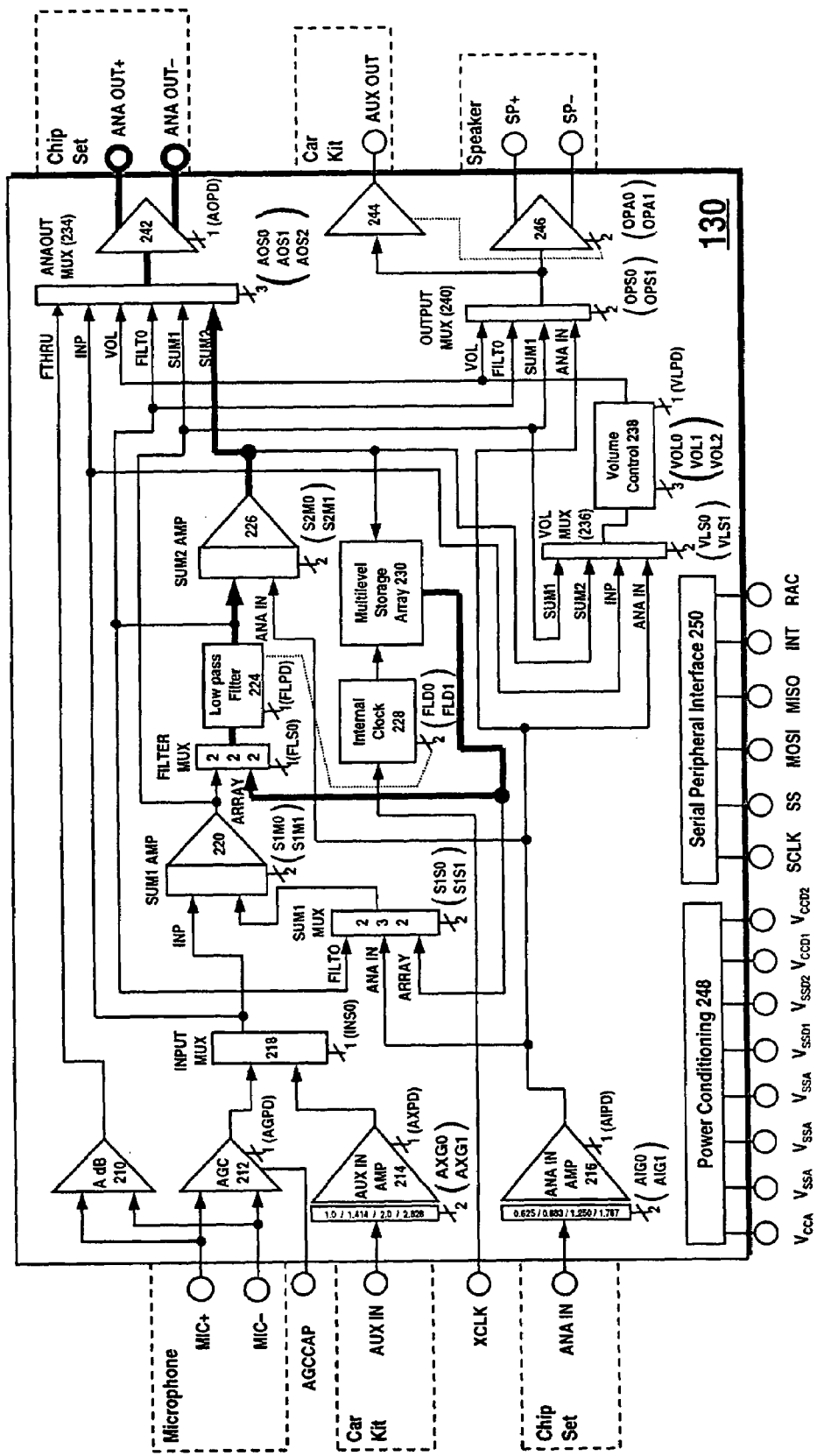

FIG. 8A illustrates the analog recording and playback device 130 of the present invention configured in a play outgoing message ("OGM") mode. This mode is used to play an outgoing message in a mobile application or in a pure answering machine application. This mode may also be used when the user is at a remote location and wishes to retrieve messages. As shown in FIG. 8A, the analog signal path is shown having highlighted lines. The circuits involved in this mode include the storage array 230, FILTER MUX 222, low pass filter 224, SUM2 AMP 226, ANAOUT MUX 234, and amplifier 242. The analog signal is transmitted from the storage array 230, through the FILTER MUX 222 and to the low pass filter 224. The low pass filter 224 anti-aliases and smoothes the analog signal, which is then transmitted to the amplifier 242, through the SUM2 AMP 226 and ANAOUT MUX 234. The amplifier 242 amplifies the analog signal for transmission upstream through the baseband circuitry 110 of FIG. 2.

FIG. 8B illustrates the commands issued to the SPI 250 for configuring the device 130 in the play OGM mode at address 0A0 (Hex). The play OGM mode also involves three commands, a first command to load configuration register zero, a second command to load configuration register one, and a third command to play from the storage array 230 starting at a particular address (row). Referring to FIG. 8B, the first command includes a command byte CMD1 followed by two bytes of data DATA1 for modifying CFG0. The second command includes a command byte CMD2 followed by two bytes of data DATA2 for modifying CFG1. The letters "b" and "c" in the FLD1 and FLD0 fields are set to establish the sampling rate for playback. The first and second commands establish the analog path. A third command including a command byte CMD3 and an address ADD commences the play operation at address 0A0(Hex). The IAB bit in CMD3 is low to indicate that the following data is an address.

It is to be appreciated that the analog recording and playback device 130 may be configured in a play mode for listening to messages locally. This mode is very similar to the play OGM message mode described in FIGS. 8A and 8B, except that the output path is through the speaker driver amplifier 246 (or the amplifier 244), rather than the amplifier 242. That is, the analog signal at the output of the SUM2 AMP 226 passes through the VOL MUX 236, volume control circuit 238, OUTPUT MUX 240, and speaker driver amplifier 246 (or the amplifier 244).

Figure 9A:
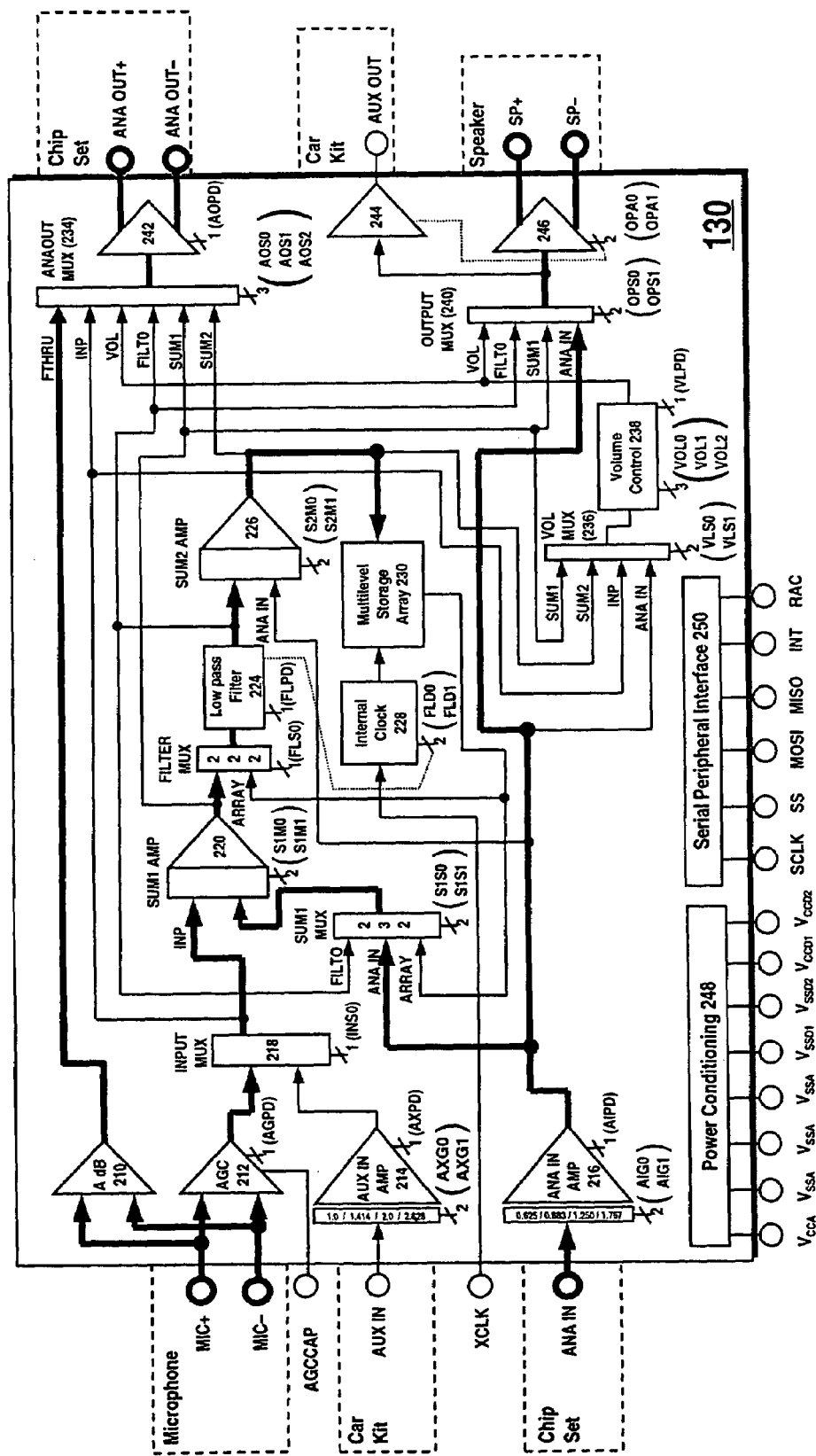

FIG. 9A illustrates the analog recording and playback device 130 of the present invention configured in a full-duplex record mode. This mode is used to record both sides of a conversation (between a user and a remote caller). Referring to FIG. 9A, the analog signal paths are shown having highlighted lines. This mode involves the circuits used in the feed-through mode (FIG. 6A) and additional circuitry for recording both sides of the conversation. The additional circuitry includes the AGC amplifier 212, INPUT MUX 218, SUM1 MUX 232, SUM1 AMP 220, FILTER MUX 222, low pass filter 224, SUM2 AMP 226, and storage array 230. The analog signal of the user is transmitted upstream to the remote caller through the signal path that includes amplifier 210, ANAOUT MUX 234, and amplifier 242. The user's analog signal is also fed to a first terminal of the SUM1 AMP 220 through the AGC amplifier 212 and the INPUT MUX 218. The remote caller's analog signal received from the ANA IN input, is transmitted through the amplifier 216, OUTPUT MUX 240, and speaker driver amplifier 246 to the user. The remote caller's analog signal is also fed to a second terminal of the SUM1 AMP 220 through the SUM1 MUX 232. The SUM1 AMP 220 mixes the two signals, to provide a mixed analog signal at the output. The mixed analog signal passes through the FILTER MUX 222, low pass filter 224, and SUM2 AMP 226, and is then stored in the storage array 230.

FIG. 9B illustrates the commands issued to the SPI 250 for configuring the device 130 in the full-duplex record mode at a particular address. The full-duplex record mode also involves three commands. Referring to FIG. 9B, the first command includes command byte CMD1 followed by two bytes of data DATA1. The second command includes command byte CMD2 followed by two bytes of data DATA2. The letters "d" and "e" in the FLD1 and FLD0 fields are set to establish the sampling rate for recording. The first and second commands establish the analog paths. A third command including command byte CMD3 and an address ADD starts the record operation at a particular address (e.g., 0A0 Hex).

FIG. 10A illustrates the analog recording and playback device 130 of the present invention configured in a full-duplex play mode. This mode is used to playback a message recorded in the storage array to a remote caller while the user is on the telephone with the remote caller. Referring to FIG. 10A, the analog signal paths are shown having highlighted lines. The first path involves mixing the user's analog signal at the microphone inputs MIC+ and MIC− with the message in the storage array 230, and transmitting the mixed analog signal upstream to the remote caller. The affected circuits in this path include the AGC amplifier 212, INPUT MUX 218, SUM1 AMP 220, FILTER MUX 222, low pass filter 224, SUM1 MUX 232, and the storage array 230. The user's analog signal, at the microphone MIC+ and MIC− inputs, is routed to a first terminal of the SUM1 AMP 220, through the AGC amplifier 212 and the INPUT MUX 218. The message stored in the storage array 230 is fed to the low pass filter 224 through the FILTER MUX 222. The output of the low pass filter 224 is applied to a second terminal of the SUM1 AMP 220 through the SUM1 MUX 232. The SUM1 AMP 220 mixes the user's analog signal with the analog signal in the storage array 230 to provide a mixed analog signal. The mixed analog signal is routed to the analog outputs ANA OUT+ and ANA OUT−, through the ANAOUT MUX 234 and amplifier 242, for transmission upstream to the remote caller.

The second path involves mixing the remote caller's analog signal with the message recorded in the storage array 230, and providing the mixed analog signal to the user. This path involves the variable gain amplifier 216, storage array 230, FILTER MUX 222, low pass filter 224, SUM2 AMP 226, VOL MUX 236, volume control circuit 238, OUTPUT MUX 240, and speaker driver amplifier 246 (or amplifier 244). The remote caller's analog signal is received at the ANA IN input, amplified by the variable gain amplifier 216, and provided to a terminal of the SUM2 AMP 226. The SUM2 AMP 226 mixes the remote caller's analog signal with the message stored in the storage array 230 (output of low pass filter 224), and provides the mixed analog signal to the volume control circuit 238 through the VOL MUX 236. The volume control circuit 238 adjusts the volume and provides the signal to speaker driver amplifier 246 (or amplifier 244) through the OUTPUT MUX 240, for driving a speaker. The user can then listen to the remote caller and the recorded message at the same time.

FIG. 10B illustrates the commands issued to the SPI 250 for configuring the device 130 in a full-duplex play mode at a particular address. Referring to FIG. 10B, the first command includes command byte CMD1 followed by two bytes of data DATA1. The second command includes command byte CMD2 followed by two bytes of data DATA2. The letters "d", "e", and "f", in the VOL2–VOL0 fields set the attenuation of the analog signal. The first and second commands establish the analog paths. A third command including command byte CMD3 and an address ADD starts the record operation at a particular address (e.g., 0A0 Hex).

Figure 11A:
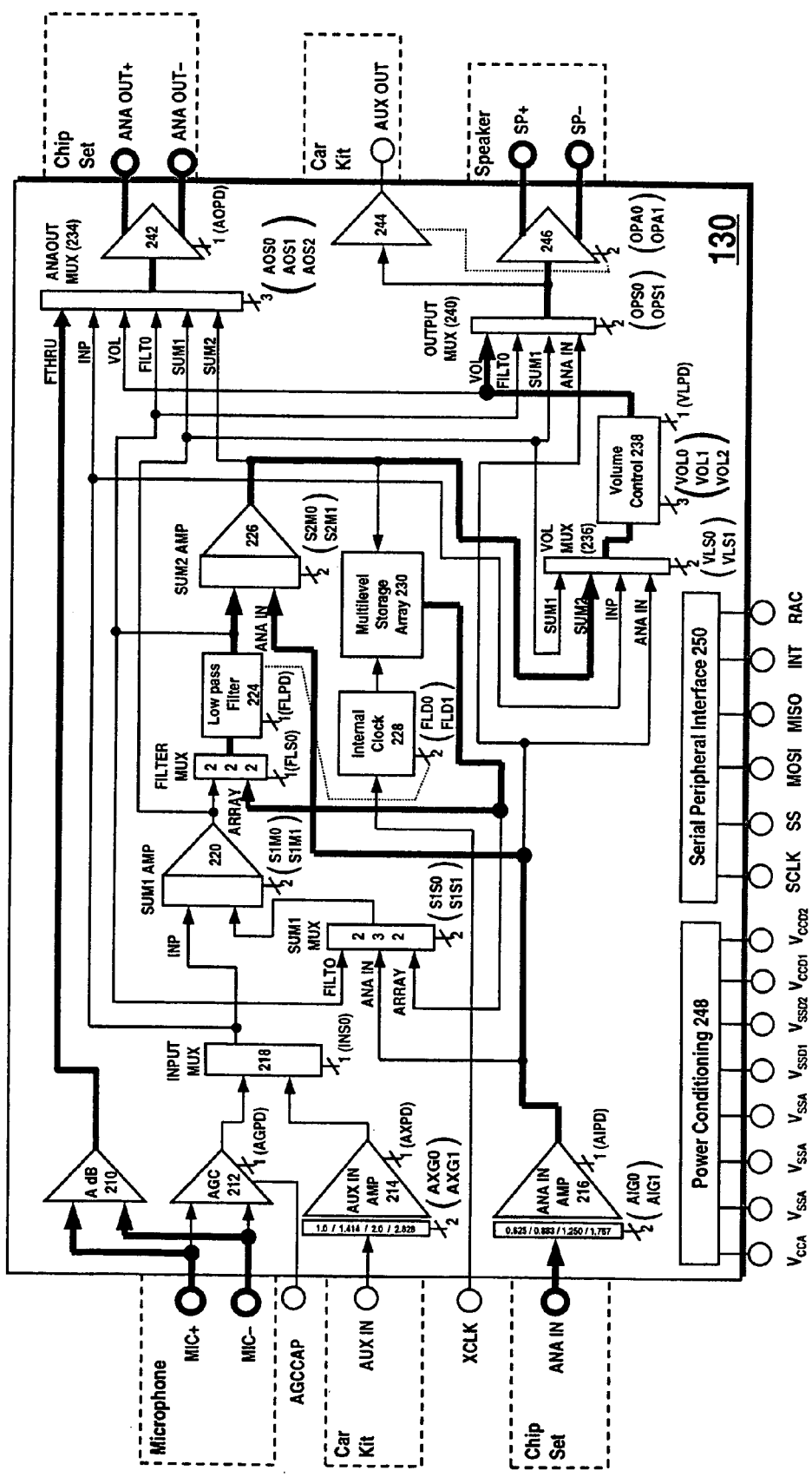

FIG. 11A illustrates the analog recording and playback device 130 of the present invention configured in a simplex play mode. This mode is similar to the full-duplex play mode with the exception that only the user can listen to the message recorded in the storage array 230 while on the line with the remote caller. The remote caller cannot hear the message. This mode is useful in situations where the user wants to retrieve and play one of many messages for the remote caller, but does not want the remote caller to listen to other messages as the user scans through the messages. This mode is also useful in situations where the user is placed "on hold" while on the telephone with a remote caller, such that the user can listen to messages. Referring to FIG. 11A, the analog signal paths are shown having highlighted lines. The first path involves transmitting the user's analog signal at the microphone inputs MIC+ and MIC− (or the AUX IN input) to the amplifier 242, through the amplifier 210 and the ANAOUT MUX 234. This path is the same as the first path in the feed-through mode of FIG. 6A. The second path is the same as the second path described with respect to FIG. 10A. Thus, in the simple play mode, the user can listen to the remote caller and messages stored in the storage array 230 at the same time, while the remote caller only hears the user's analog signal. FIG. 11B illustrates the commands issued to the SPI 250 for configuring the device 130 in the simplex play mode at a particular address (e.g., 0A0 Hex).

Figure 12A:
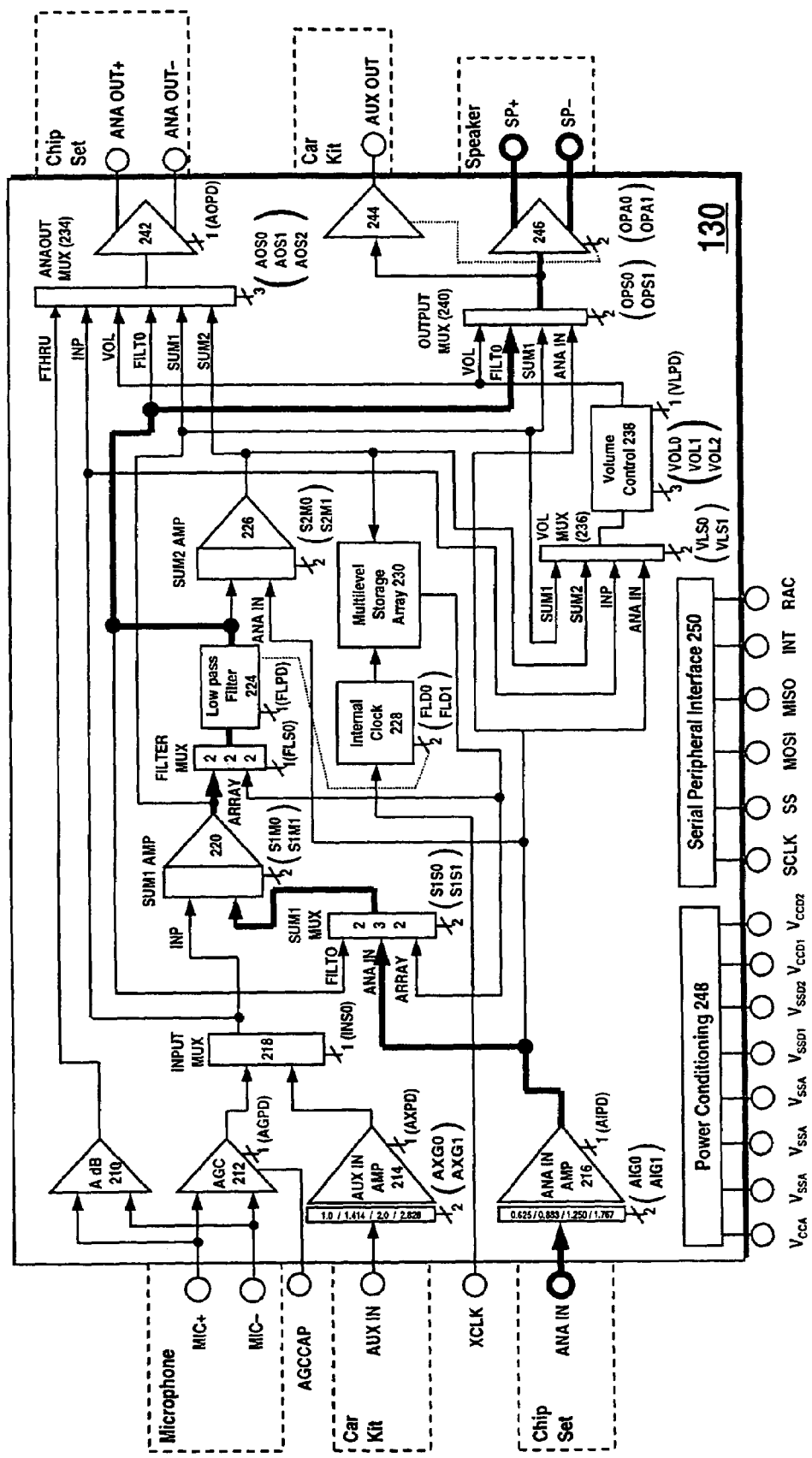

FIG. 12A illustrates the analog recording and playback device 130 of the present invention configured in voice pager mode. This mode is used in a voice pager application where the voice pager may be incorporated into the mobile communication system 100 (FIG. 2) of the present invention or the analog recording and playback system 130 may be incorporated into a voice pager system (not shown). In this mode, digital information (e.g., a digital coded voice signal) is received by a pager which applies the digital information to a digital-to-analog converter to provide an unfiltered analog signal. The unfiltered analog signal is then applied to the ANA IN input of the system 130. The circuits involved include the variable gain amplifier 216, SUM1 MUX 232, SUM1 AMP 220, FILTER MUX 222, low pass filter 224, OUTPUT MUX 240, and amplifier 246 (or amplifier 244). The analog signal at the ANA IN input is transmitted to the low pass filter, which filters the analog signal. The analog signal is then output through the speaker driver amplifier 246 for driving a speaker. The analog signal can also be stored in the storage array 230. FIG. 12B illustrates the commands issued to the SPI 250 for configuring the device 130 in a voice pager mode.

The analog recording and playback system provides flexibility in controlling the analog paths of a duplex communication device. Specifically, it is designed to provide an interface between the user (microphone and speaker) and further processing blocks (such as cellular baseband module or cellular car-kit adapter). By gaining control of both upstream and downstream signal flows, the system can perform functions such as duplex recording and playback, voice mail functions, memo recording, and many other functions. The flexibility of the input and output configurations allows the chip to interface with a wide range of signal sources and processors. Moreover, the analog recording and playback system further allows the record/playback duration for each message to be changed from one of four sample rates.

Integration of such functions adds value and flexibility not previously realizable. This is achieved by providing user configurable analog processing blocks. These analog processing blocks include, for example, summation amplifiers that allow mixing of two signal sources, volume control circuit that allows the attenuation of a signal in a plurality of steps, etc.

The analog recording and playback system also provides a flexible interface that minimizes external components. Multiple inputs are available including a low signal level differential microphone input with AGC or fixed gain capabilities, an auxiliary input with four gain settings to interface to line level signals, and a high level analog input with four gain settings to interface to output drivers. Multiple outputs are also available to provide duplex signal flow. These outputs include a differential analog output to deliver high quality audio to further processing blocks (e.g., a cellular baseband module), a speaker driver output, and an auxiliary output to interface to a secondary output device (e.g., a cellular car kit).

The analog recording and playback system also simplifies and expedites integration into systems such as mobile telephones, answering machines, portable devices, etc. The device has low power consumption and a low supply voltage (e.g., 3 volts), providing a longer battery life, which is crucial in mobile telephone applications and other portable device applications.

The present invention combines a fully integrated programmable signal interface with a highly configurable voice path to maximize flexibility and ease system integration with all wireless and cordless chipsets. This provides a flexible voice feature chip for the digital technology being used, whether it's global system for mobile telecommunications ("GSM"), time-division multiple access ("TDMA"), or code-division multiple access ("CDMA"). The hardware/software "drop-in" simplicity of the present invention allows mobile telephone manufacturers to bring their telephones to market faster. In addition to (analog and digital) cellular handsets, other applications utilizing the present invention include wireless local loop handsets, telephone answering machines, cordless telephones, automotive communication devices such as traffic information, storage and voice interface for navigation systems, pocket recorders/programmable digital assistants, dictation devices, language translators, music-on-hold systems, and the like.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An analog signal recording and playback system comprising:
    an integrated circuit having:
        first and second analog inputs configured to receive first and second separate analog input signals;
        first and second analog outputs configured to provide first and second separate analog output signals;
        a storage array configured to store analog signals and having record and playback capabilities;
        an interface configured to receive digital control information and control the read and write capability of the storage array and the selective coupling of the first and second analog inputs, the first and second analog outputs and the storage array to select any one of the following:
        a) couple the first analog input signal received by the first analog input to the first analog output to provide the first analog output signal, and couple the second analog input signal received by the second analog input to the second analog output to provide the second analog output signal;
        b) couple the first analog input signal received by the first analog input to the storage array and to place the storage array in the record mode;
        c) couple the storage array to the first analog output to provide the first analog output signal and to place the storage array in the playback mode;
        d) couple the first analog input signal received by the first analog input to the first analog output to provide the first analog output signal, couple the second analog input signal received by the second analog input to the second analog output to provide the second analog output signal, couple a combination of the first analog input signal from the first analog input and the second analog input signal from the second analog input to the storage array, and place the storage array in the record mode;
        e) place the storage array in the playback mode, couple a combination of a playback signal from the storage array and the first analog input signal from the first analog input to the first analog output to provide the first analog output signal, and couple a combination of a playback signal from the storage array and the second analog input signal from the second analog input to the second analog output to provide the second analog output signal;
        f) couple the first analog input signal from the first analog input to the first analog output to provide the first analog output signal, place the storage array in the playback mode, and couple a combination of a playback signal from the storage array and the second analog input signal from the second analog input to the second analog output to provide the second analog output signal; and,
        g) couple the second analog input signal from the second analog input to the second analog output to provide the second analog output signal.

2. The system of claim 1 wherein in g), the second analog input signal received by the second analog input is coupled to the second analog output through a filter to provide the second analog output signal.

3. The system of claim 2 wherein the filter is a low pass filter.

4. The system of claim 1 wherein the storage array configured to store analog signals and having record and playback capabilities is a multilevel analog memory storage array.

5. The system of claim 1 wherein the interface is a serial digital interface.

6. The system of claim 1 further comprised of an automatic gain control circuit coupled to the first analog input.

7. The system of claim 1 wherein the interface further controls the gain of a signal coupled to the second analog input.

8. The system of claim 1 wherein the interface further controls the gain of a signal coupled to the second analog output.

9. The system of claim 1 wherein the second analog output includes a speaker driver amplifier.

10. The system of claim 1 wherein the first analog input is a microphone input.

11. An analog signal recording and playback system comprising:
    an integrated circuit having:
        first, second and third analog inputs;
        first, second and third analog outputs, the third analog output being coupled to a signal coupled to the second analog output;
        a storage array configured to store analog signals and having record and playback capabilities;
        an interface configured to receive digital control information and control the read and write capability of the storage array and the selective coupling of the first, second and third analog inputs, the first and second analog outputs and the storage array to select any one of the following:

a) couple the first analog input to the first analog output, and the second analog input to the second analog output;
b) couple the first or third analog input to the storage array and to place the storage array in the record mode;
c) couple the storage array to the first analog output and to place the storage array in the playback mode;
d) couple the first or third analog input to the first analog output, couple the second analog input to the second analog output, couple a combination of a signal from the first or third analog input and a signal from the second analog input to the storage array, and place the storage array in the record mode;
e) place the storage array in the playback mode, couple a combination of a playback signal from the storage array and a signal from the first analog or third input to the first analog output, and couple a combination of a playback signal from the storage array and a signal from the second analog input to the second analog output;
f) couple the first or third analog input to the first analog output, place the storage array in the playback mode, and couple a combination of a playback signal from the storage array and a signal from the second analog input to the second analog output; and,
g) couple the second analog input to the second analog output.

12. The system of claim 11 wherein in g), the second analog input is coupled to the second analog output through a filter.

13. The system of claim 12 wherein the filter is a low pass filter.

14. The system of claim 11 wherein the storage array configured to store analog signals and having record and playback capabilities is a multilevel analog memory storage array.

15. The system of claim 11 wherein the interface is a serial digital interface.

16. The system of claim 11 further comprised of an automatic gain control circuit coupled to the first analog input.

17. The system of claim 11 wherein the interface further controls the gain of a signal coupled to the second analog input.

18. The system of claim 11 wherein the interface further controls the gain of a signal coupled to the third analog input.

19. The system of claim 11 wherein the interface further controls the gain of a signal coupled to the second analog output.

20. The system of claim 11 wherein the second analog output includes a speaker driver amplifier.

21. The system of claim 11 wherein the first analog input is a microphone input.

* * * * *